(12) United States Patent
Li

(10) Patent No.: US 7,380,227 B1
(45) Date of Patent: May 27, 2008

(54) AUTOMATED CORRECTION OF ASYMMETRIC ENCLOSURE RULE VIOLATIONS IN A DESIGN LAYOUT

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 400 days.

(21) Appl. No.: 11/261,960

(22) Filed: Oct. 28, 2005

(51) Int. Cl.
*G06F 17/50* (2006.01)
(52) U.S. Cl. .............................................. 716/5; 716/4
(58) Field of Classification Search ................. 716/4–5
See application file for complete search history.

(56) References Cited

U.S. PATENT DOCUMENTS

| | | | |
|---|---|---|---|
| 6,536,023 B1 * | 3/2003 | Mohan et al. ................. | 716/5 |
| 6,883,149 B2 | 4/2005 | Li et al. | |
| 6,892,368 B2 | 5/2005 | Li et al. | |
| 2006/0253817 A1 * | 11/2006 | Meyer et al. ................. | 716/5 |

\* cited by examiner

*Primary Examiner*—Paul Dinh
(74) *Attorney, Agent, or Firm*—Robert C. Kowert; Mayertons, Hood, Kivlin, Kowert & Goetzel, P.C.

(57) ABSTRACT

Automated techniques may correct certain rule violations, simplifying and automating the design layout of an electronic circuit, whether embodied as a design encoding or as a fabricated electronic circuit. Violations of enclosure design rules, those specifying the minimum amount that a geometry on a first layer must overlap a geometry on a second layer of a design layout, and more specifically, violations of asymmetric enclosure design rules, may be corrected using a geometric construction algorithm. This geometric construction algorithm may use the known width of the geometry on the second layer and a predetermined size factor to determine other parameters for constructing and placing a patch over a violation, such as the patch width, the patch length, the patch starting edge, and the patch direction. Patches may be constructed using different predetermined size factors when asymmetric enclosure violations are located on first layer geometries in different width ranges.

16 Claims, 18 Drawing Sheets

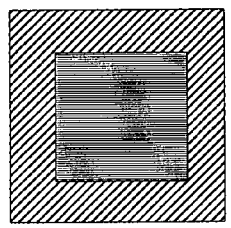
FIG. 2A
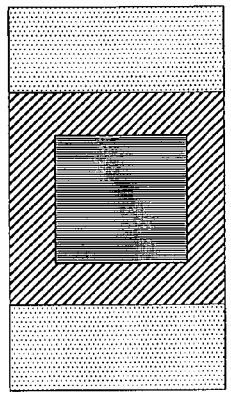
FIG. 2B
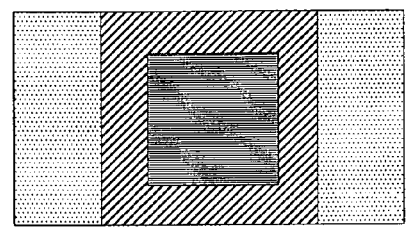
FIG. 2C
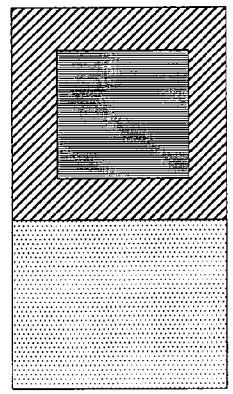
FIG. 2D
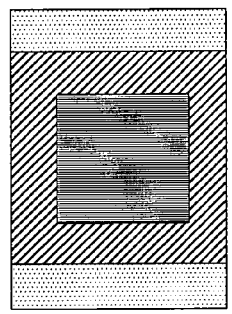
FIG. 2E
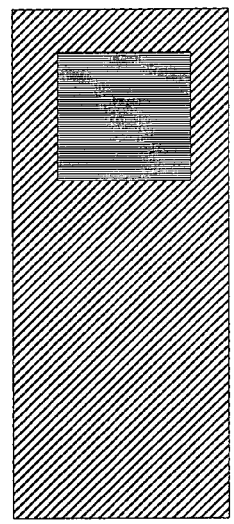
FIG. 2F
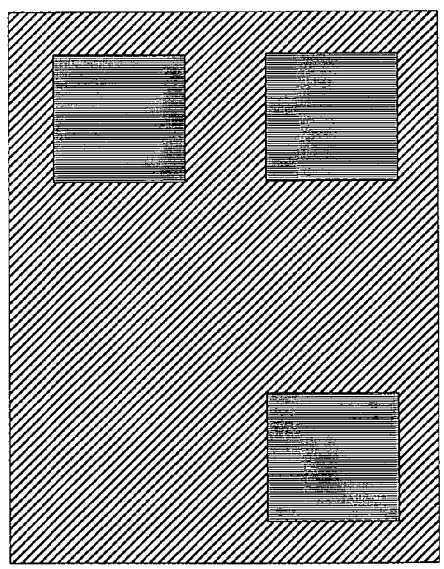
FIG. 2G
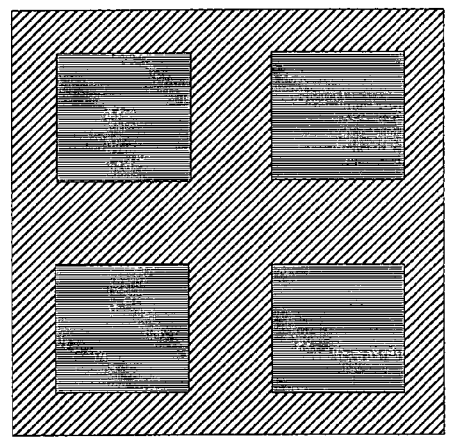
FIG. 2H
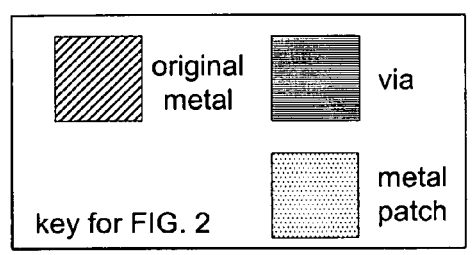
key for FIG. 2

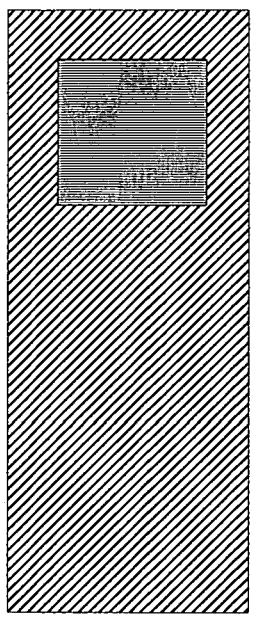
*FIG. 5A*
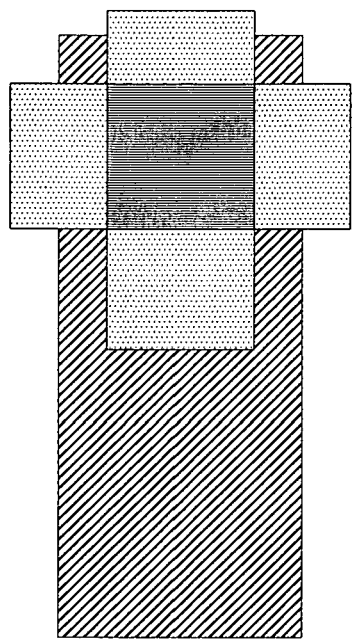
*FIG. 5B*
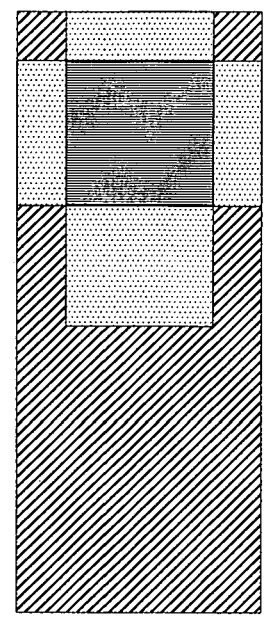
*FIG. 5C*
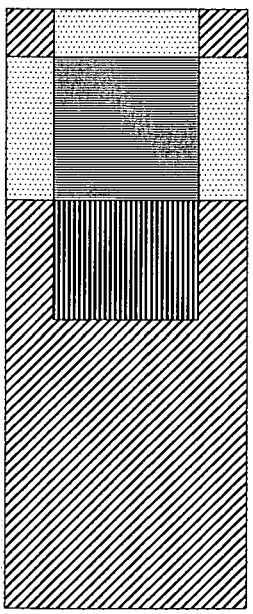
*FIG. 5D*
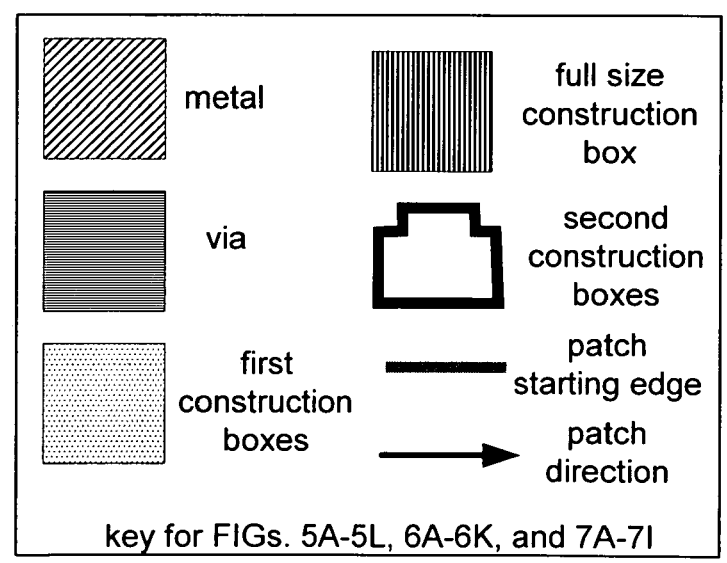

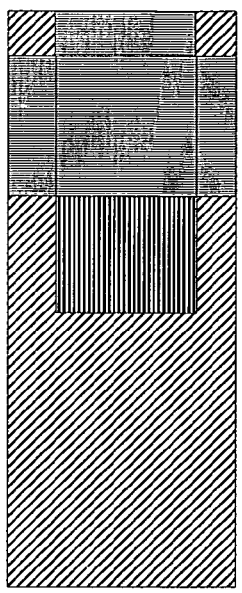
*FIG. 5E*
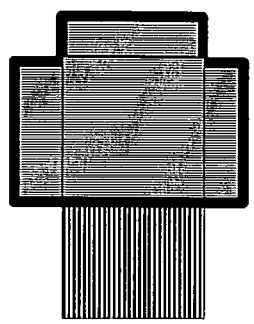
*FIG. 5F*
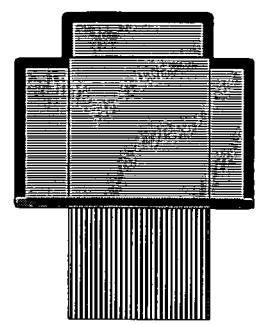
*FIG. 5G*
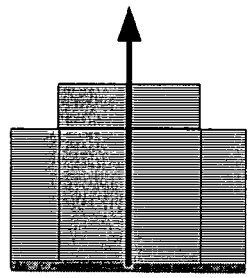
*FIG. 5H*
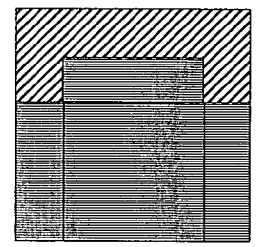
*FIG. 5I*
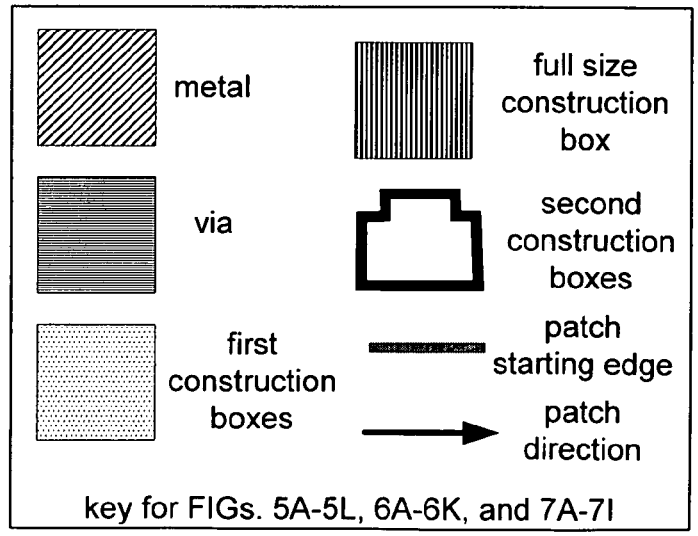
key for FIGs. 5A-5L, 6A-6K, and 7A-7I

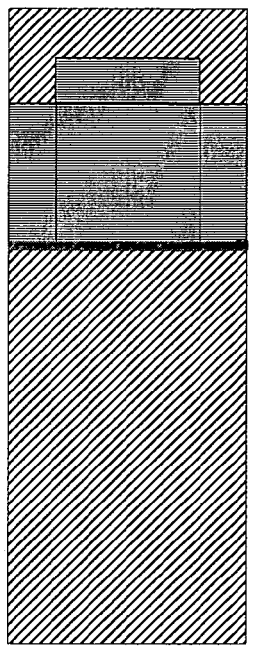
*FIG. 5J*
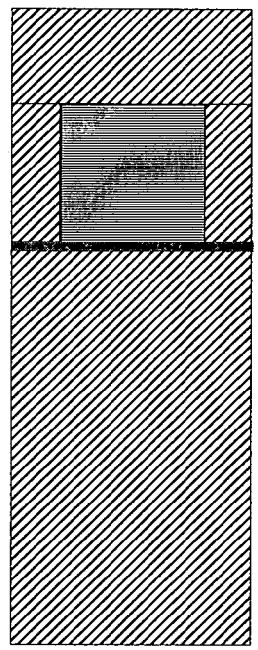
*FIG. 5K*
*FIG. 5L*
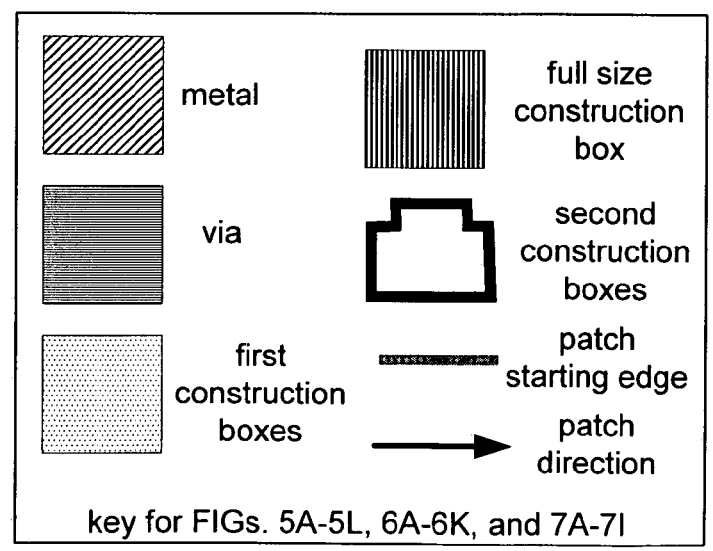

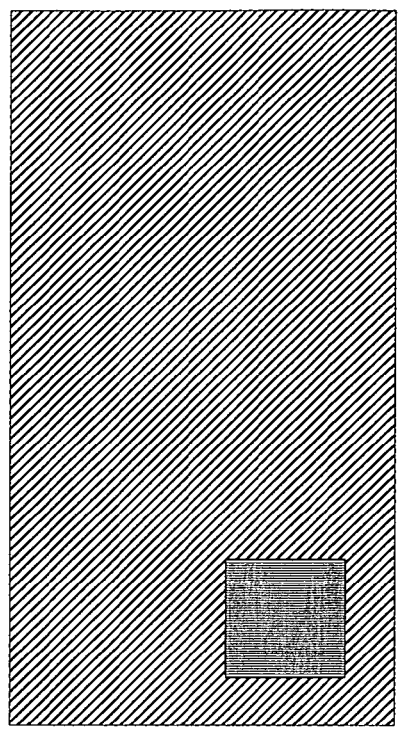
*FIG. 6A*
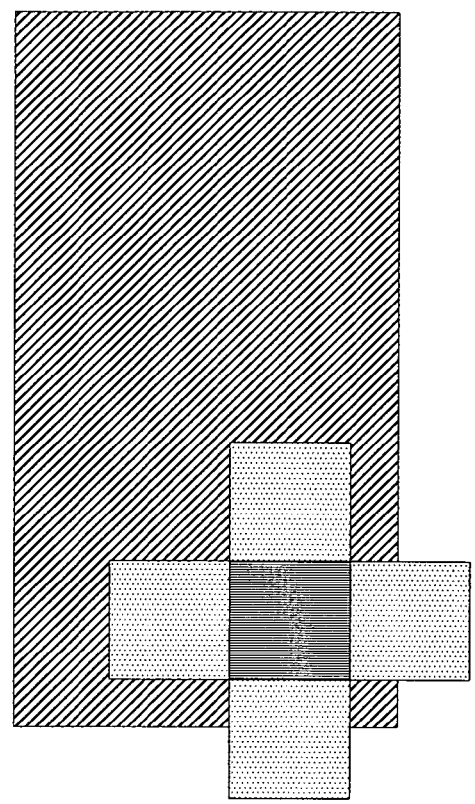
*FIG. 6B*
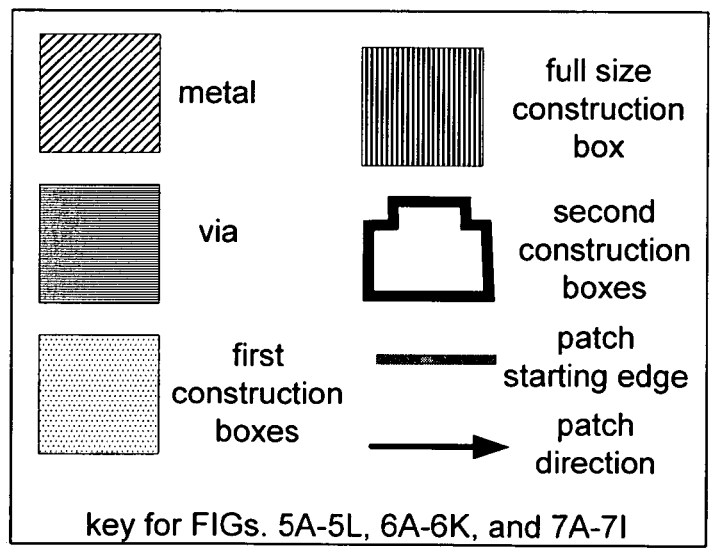

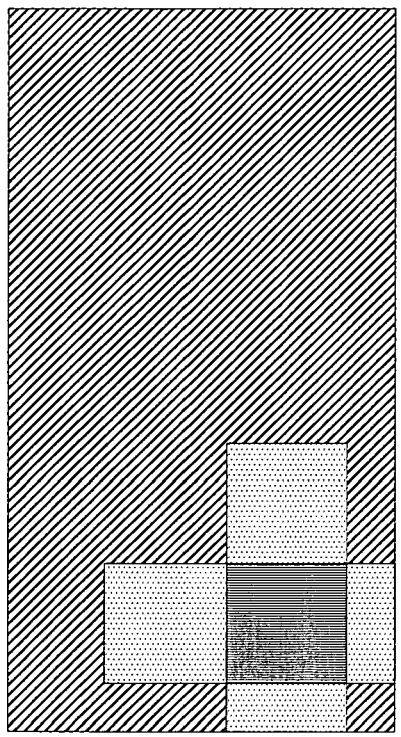
*FIG. 6C*
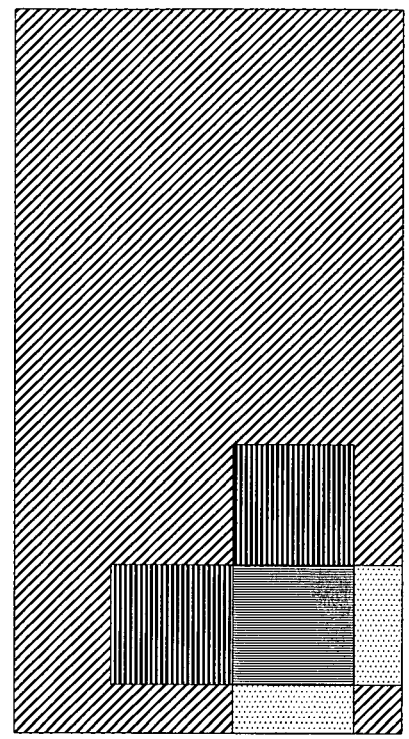
*FIG. 6D*
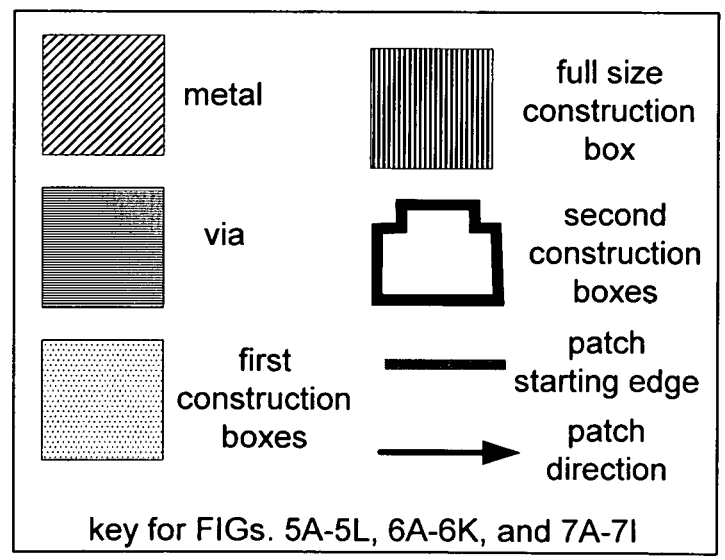

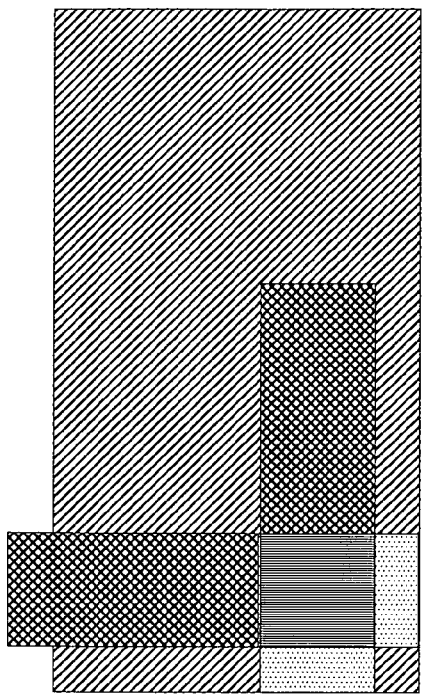
*FIG.6E*
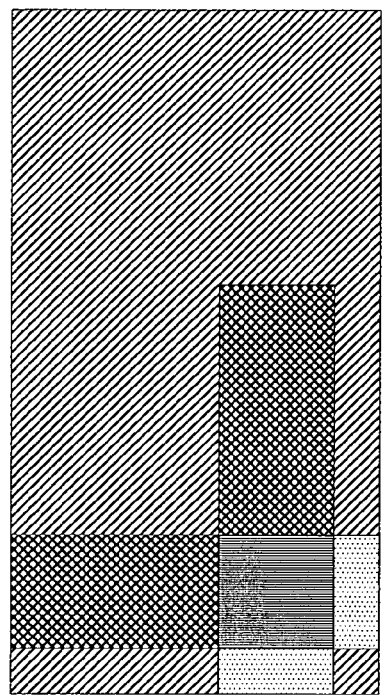
*FIG. 6F*
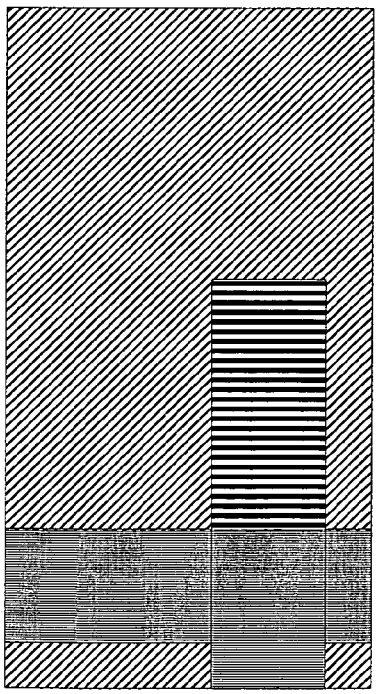
*FIG.6G*
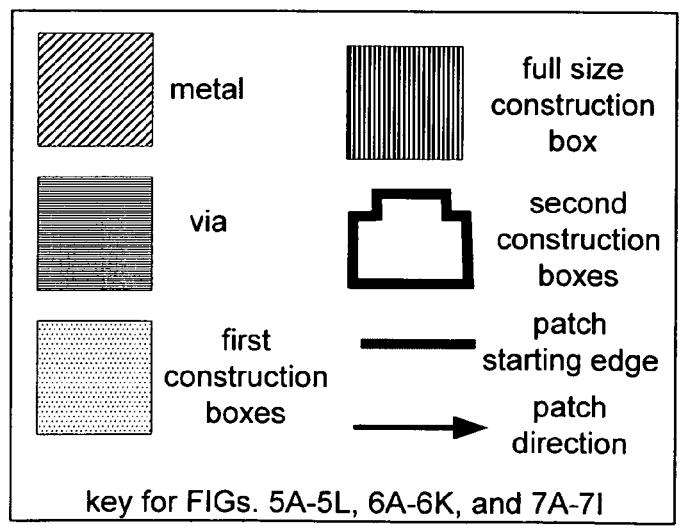
key for FIGs. 5A-5L, 6A-6K, and 7A-7I

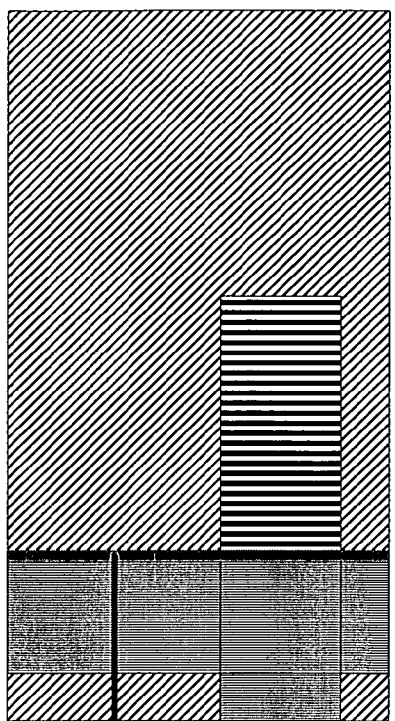
FIG. 6H
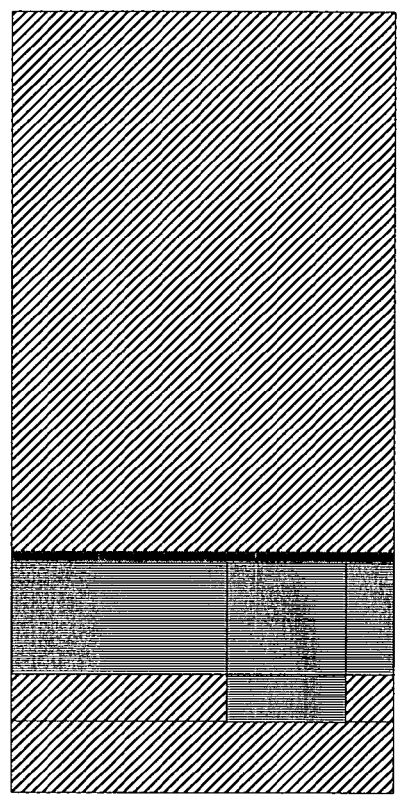
FIG. 6I
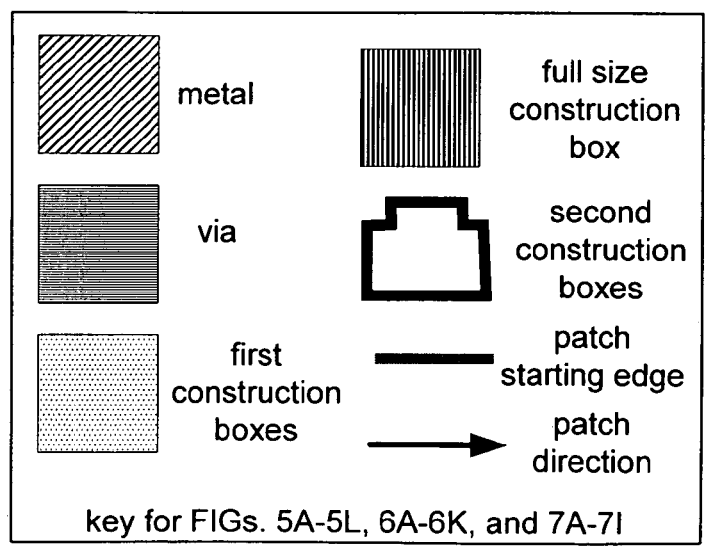
key for FIGs. 5A-5L, 6A-6K, and 7A-7I

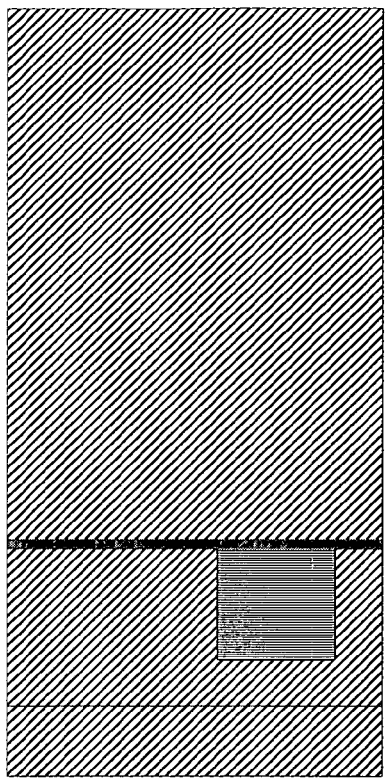
*FIG. 6J*
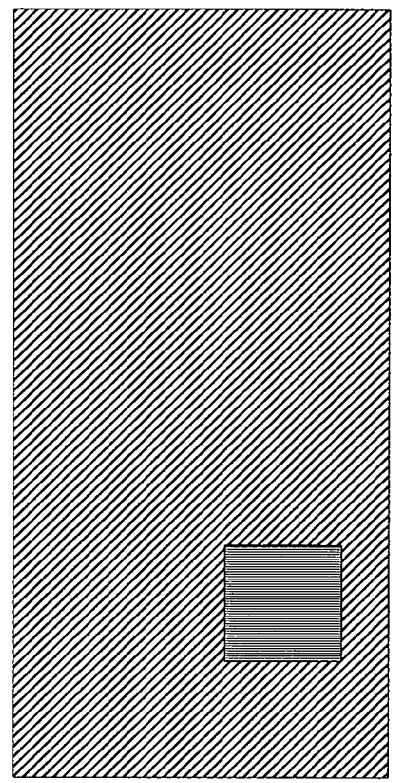
*FIG. 6K*
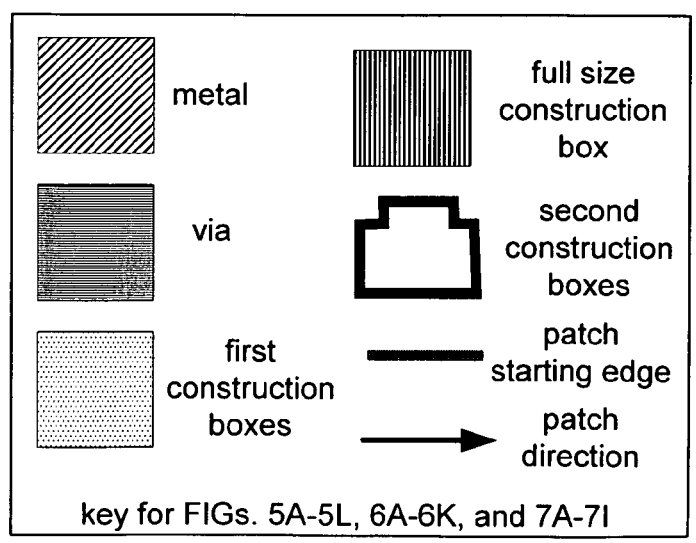

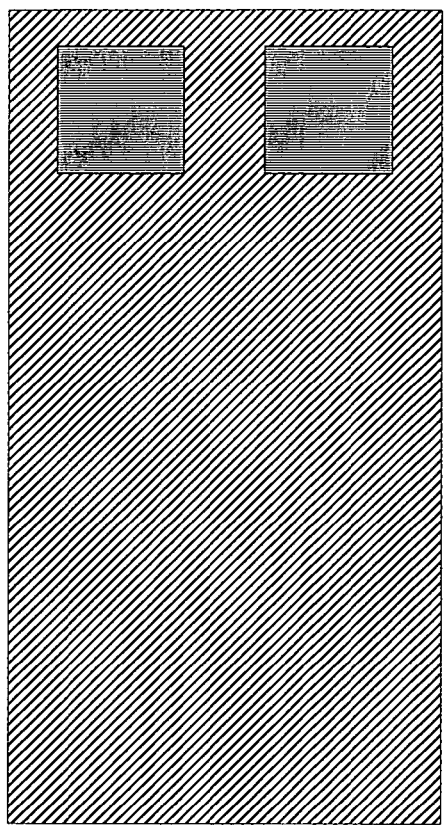
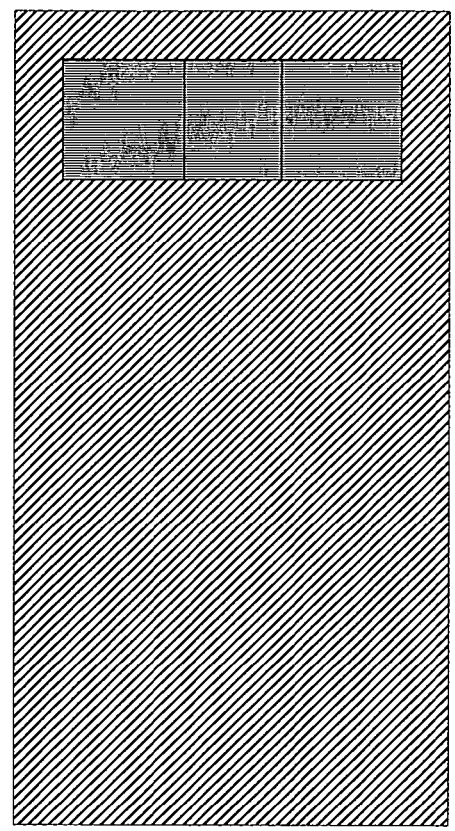
*FIG. 7A*  *FIG. 7B*
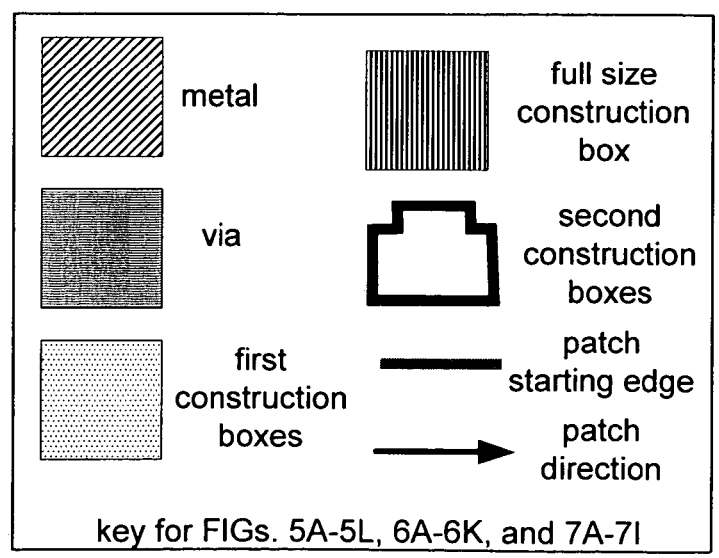
key for FIGs. 5A-5L, 6A-6K, and 7A-7I

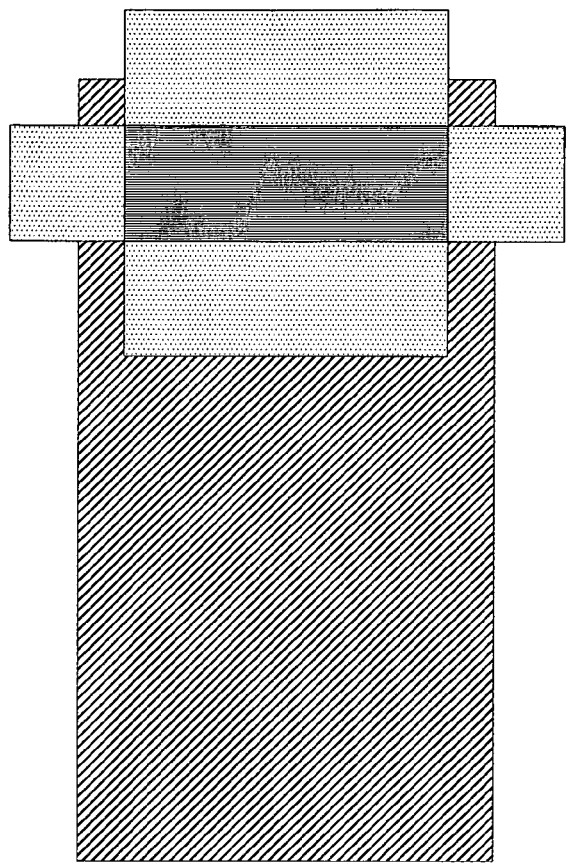
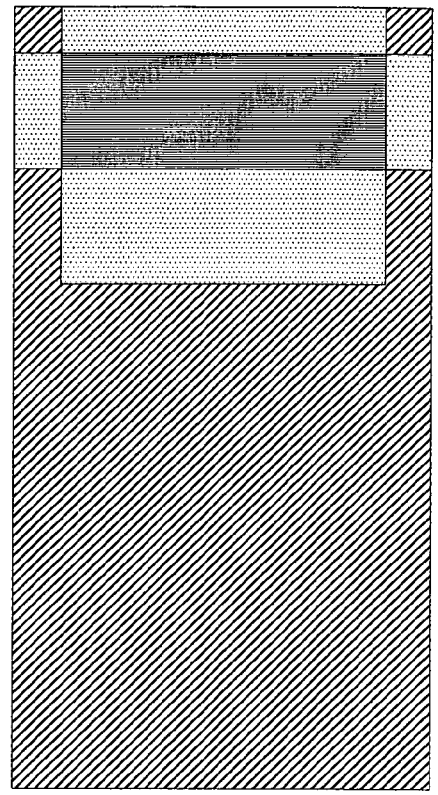
FIG. 7C
FIG. 7D
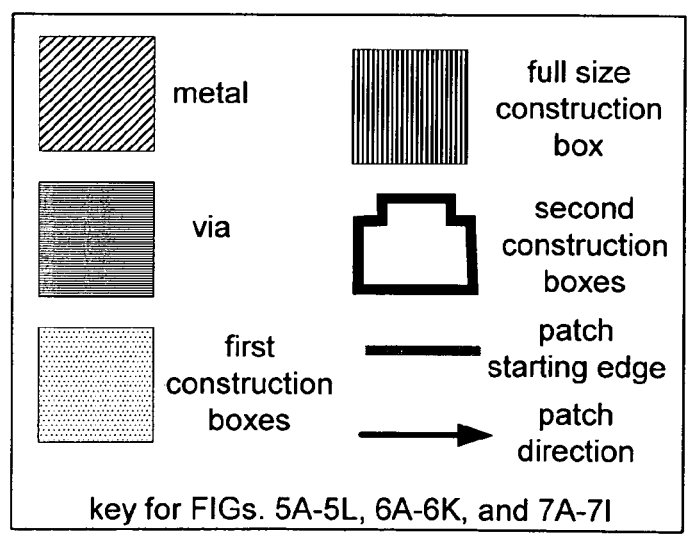
key for FIGs. 5A-5L, 6A-6K, and 7A-7I

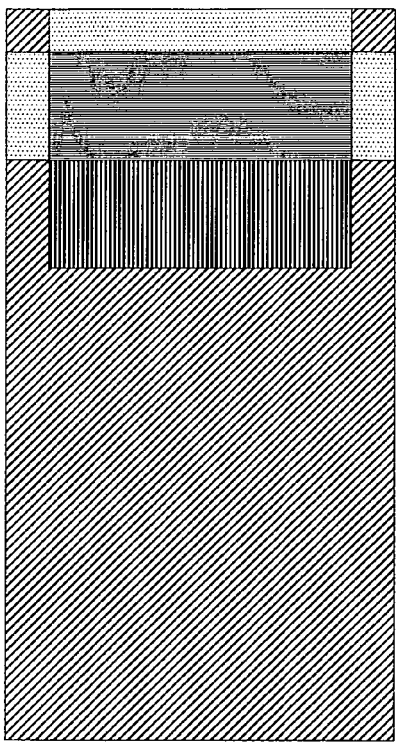
*FIG. 7E*
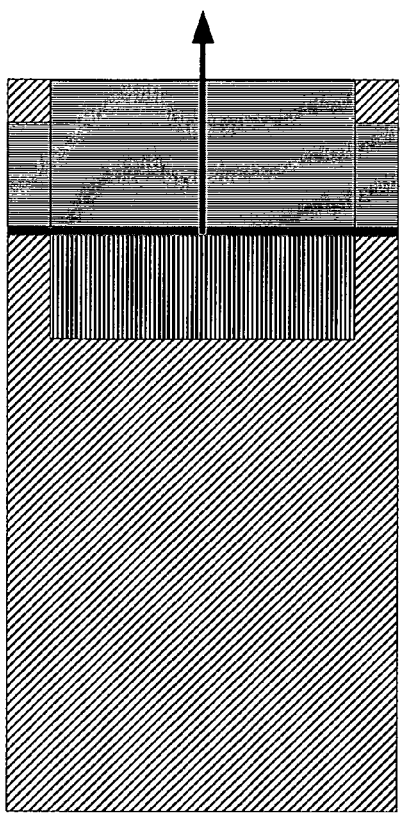
*FIG. 7F*
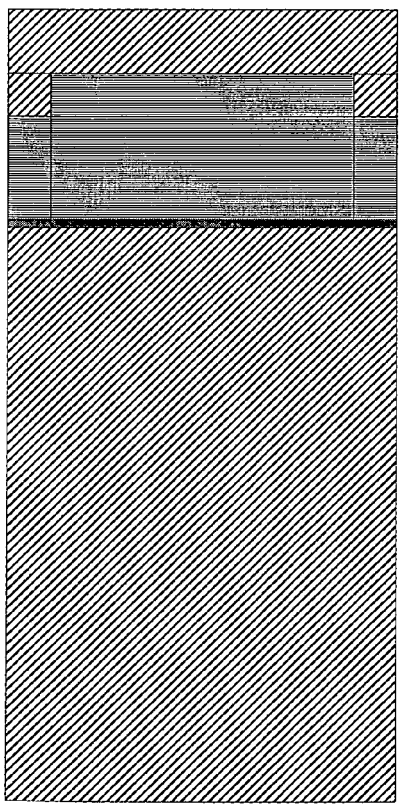
*FIG. 7G*
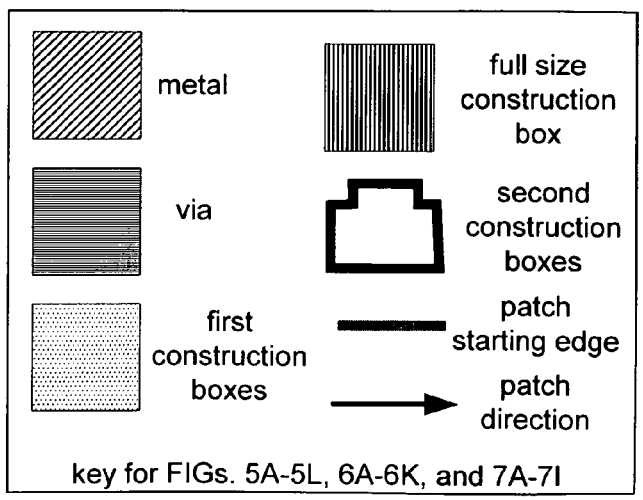
key for FIGs. 5A-5L, 6A-6K, and 7A-7I

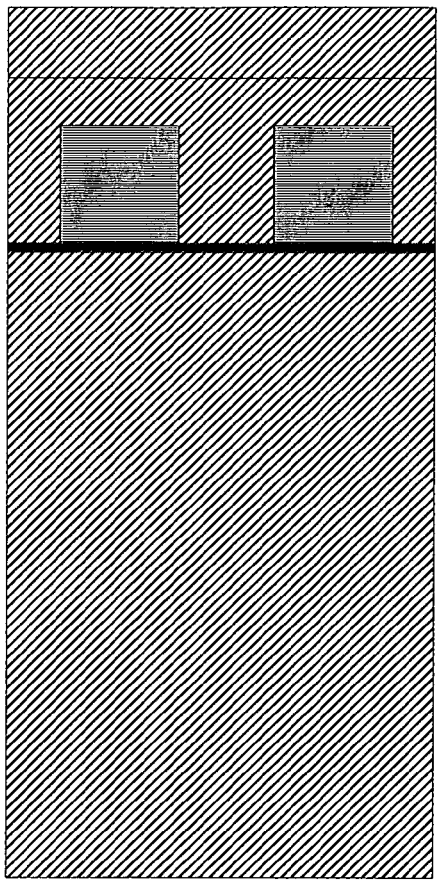
FIG. 7H
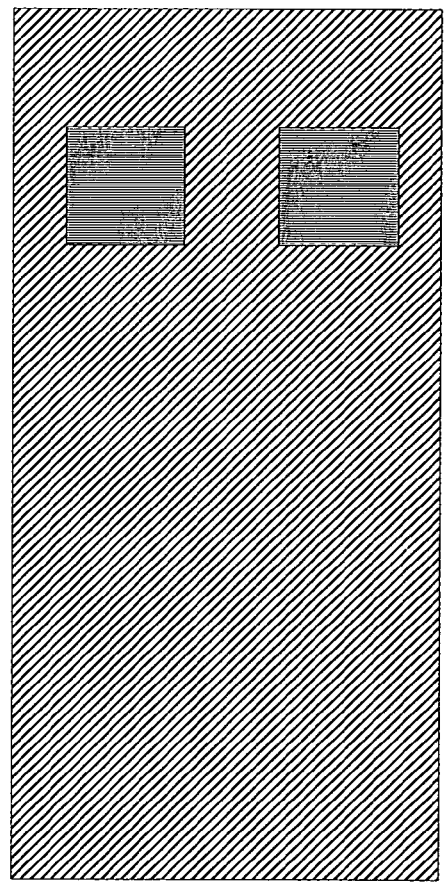
FIG. 7I
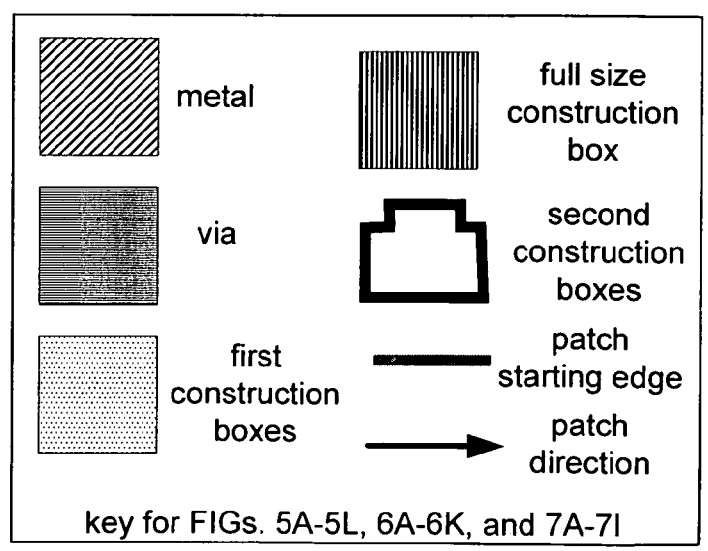
key for FIGs. 5A-5L, 6A-6K, and 7A-7I

AUTOMATED CORRECTION OF ASYMMETRIC ENCLOSURE RULE VIOLATIONS IN A DESIGN LAYOUT

BACKGROUND OF THE INVENTION

1. Field of the Invention

This invention relates to the layout of electronic circuits and more particularly to complex computer aided design layout and correction of rule violations in a design layout of, for example, an integrated circuit (IC) device or printed wiring board, in preparation for fabrication.

2. Description of the Relevant Art

Design of an electronic circuit, for example, an integrated circuit (IC), is a complicated and time-consuming process. FIG. 1 illustrates a typical design flow of an integrated circuit device from conception through the generation of a fabrication ready design layout. Generally, the design flow commences with defining the design specifications or requirements, such as required functionality and timing, as indicated at 110. The requirements of the design are implemented, for example, as a net-list or electronic circuit description, as indicated at 120. The implementation can be performed by, for example, schematic capture (drawing the design with a computer aided design tool) or more typically, utilizing a high-level description language such as VHDL, Verilog and the like. The implemented design may be simulated to verify design accuracy, as indicated at 130. Design implementation and simulation may be iterative processes. For example, errors found by simulation may be corrected by design implementation and re-simulated.

Once the design is verified for accuracy with simulation, a layout of the design is created, as indicated at 140. The design layout may describe the detailed design geometries and the relative positioning of each design layer to be used in actual fabrication of the electronic circuit and is typically implemented as one or more design files encoding representations of the layers and geometries. The design layout is typically very tightly linked to overall circuit performance (area, speed and power dissipation) because the physical structure defined by the design layout determines, for example, the transconductances of the transistors, the parasitic capacitances and resistances of the circuit, and the silicon area is used to realize a certain function. The detailed design layout may require a very intensive and time-consuming design effort and is typically performed utilizing specialized computer aided design (CAD) or Electronic Design Automation (EDA) tools.

During creation of the design layout, a place and route tool is often used to place geometries on various layers of the design layout and to connect or route the cells together. In modern semiconductor design technologies, many metal layers are used to implement interconnections throughout an integrated circuit. For some integrated circuits, one or more polysilicon (poly) layers, or even active areas, are also used to implement interconnections. During the routing process, when a wire or other feature on one layer needs to be connected to a wire or another feature on another layer, a geometry representing a cut in an insulating layer between the two layers, called a via, is added to the layout design. During fabrication, a cut will be made in the insulating layer and the space will be filled in with a conductor (e.g. metal) in order to connect the wires/features. The size and shape of the cut are defined by a geometry (via) drawn on a via layer during creation of the design layout. Vias may be used to connect from one metal or polysilicon layer to another metal or polysilicon layer. For example, a via may be used to connect a feature (i.e., a design geometry) on each of two metal layers. The lower one of the two layers may be referred to as the landing metal layer and the upper one of the two layers may be referred to as the covering layer.

Once the design layout is created, it is checked against a set of design rules in a design rule check (DRC) operation, as indicated at 150. The created design layout typically must conform to a complex set of design rules in order, for example, to ensure a lower probability of fabrication defects. The design rules specify, for example, how far apart various geometries on different layers must be, or how large or small various aspects of the layout must be for successful fabrication, given the tolerances and other limitations of the fabrication process. A design rule may be, for example, a minimum spacing amount between geometries on a single layer or a minimum overlap of a geometry on one layer over a geometry on another layer. Design rules are typically closely associated to the technology, fabrication process and design characteristics. For example, different minimum spacing amounts between geometries may be specified for different sizes of geometries. DRC may be a time-consuming, iterative process that often requires manual manipulation and interaction by the designer. The designer may perform design layout and DRC iteratively, reshaping and moving design geometries to correct all layout errors and achieve a DRC-clean (violation-free) design.

Circuit extraction is performed after the design layout is completed and error free, as illustrated at 160. The extracted circuit may identify individual transistors and interconnections, for example, on various layers, as well as the parasitic resistances and capacitances present between the layers. A layout versus schematic check (LVS) may be performed, as indicated at 170, where the extracted net-list is compared to the design implementation created at 120. LVS may ensure that the design layout is a correct realization of the intended circuit topology. Any errors such as unintended connections between transistors, or missing connections/devices, etc., may be corrected in the design layout before proceeding to post-layout simulation, as indicated at 180. The post-layout simulation may be performed using the extracted net-list, which may provide an assessment of the circuit speed, the influence of circuit parasitics (such as parasitic capacitances and resistances), and any glitches that may occur due to signal delay mismatches. Once post-layout simulation is complete and errors found by DRC are corrected, the design may be ready for fabrication and may be sent to a fabrication facility.

As electronic circuit densities increase and technology advances, for example, in deep sub-micron circuits, skilled designers attempt to maximize the utilization of the design layout area and the manufacturability and reliability of the circuit. For example, the density of a layer may be increased, additional vias added to interconnection areas, and the like. Deep sub-micron designs typically have stringent design rules that are often not recognized or not properly handled by existing EDA tools, for example, automated place and route tools. Therefore, when creating a design layout at 140, for example, many design rule violations may be created that must be corrected. As circuit densities increase, some of these design rules may be defined asymmetrically. For example, a design rule for spacing between two geometries or for minimum overlap of one geometry over another may have different values depending on the direction or orientation of the geometries with respect to each other.

Most design technologies include via enclosure rules to ensure that both the landing metal and the covering metal enclose the via by a certain amount. In other words, such an enclosure rule ensures that each metal layer overlaps a via with a certain amount of extra metal to ensure that the via provides a good connection between the two metal layers once fabricated. The design rule specifying the extra amount of metal around each via may be referred to as a "metal enclosure of a via" design rule, and at times simply as a via enclosure design rule.

In a modern semiconductor design technology, especially for a deep sub-micron design, poly and metal layers which are used to implement connections through vias apply different via enclosure rules depending on the width of the metal or poly in the vicinity of the via. When a via is placed in a wide metal area, it may need more metal enclosure than that of a via which is placed in a narrower metal area. When a via is partially in wide metal area and partially in non-wide metal area, it may need different metal enclosure in each different area. In general, as the design technology advances, more and more width classes of metal features may be used in a design layout, and each metal width class, or range, may have different via enclosure design rules.

Nanometer technologies may also contain asymmetric via enclosure design rules. For example, in some technologies and associated design rules, an "end metal overlap of via" violation, sometimes referred to as an endlap violation, may occur when a via cut is located near the end of a metal path. In such technologies, the minimum amount that the metal must overlap the via may be greater on the side nearest the end of the metal path than the minimum amount that the metal must overlap the via on the other sides of the via, according to an associated design rule. In such cases, if the metal nearest the end of the metal path does not overlap the via on that side by this greater amount, an endlap violation may occur. Additionally, in technologies with multiple width classes for interconnect layers (e.g., poly and metal layers), different enclosure rules may apply to each width class. With advancing design technology, more and more width classes may be used in a design layout, each having one or more respective via enclosure design rules.

Asymmetric via enclosure design rules give designers more flexibility to use narrow metal paths to hold vias. They may also help in fabrication, because they may reduce the need for jogs in a design that are created when metal must enclose a via cut by a relatively large amount on all sides. However, it is difficult for conventional EDA tools to construct a design to meet these types of design rules, because most conventional EDA tools are two-dimensional programs that are good at treating objects in both dimensions simultaneously or symmetrically, but not asymmetrically. Therefore, after routing, some metal paths created by conventional EDA tools, typically routing tools, may violate asymmetric endlap design rules. A metal patch may be placed over an endlap rule violation to correct it, in many cases. However, unless carefully and often manually performed, patches may cause additional design rule violations. For example, a metal patch placed over the end of a metal path may cause a minimum metal spacing rule violation or a jog rule violation. Also, with existing tools, it may be difficult or impossible to determine the correct location, orientation and dimensions for such patches without time-consuming manual intervention by the designer.

Several examples of the creation and incidental correction of various endlap violations are illustrated in FIGS. 2A-2H and described herein. In a first example of an endlap violation, the metal surrounding the via shown in FIG. 2A violates both a minimum metal area rule and an end metal enclosure of a via (endlap) rule. To correct the minimum metal area violation, a conventional EDA tool may place a patch centered on the via as shown in FIG. 2B or as shown in FIG. 2C for vertical and horizontal routing directions respectively. In both of these cases, the metal patch may enclose the via asymmetrically, correcting the endlap violation automatically as an artifact of correcting the minimum metal area violation.

In another example involving both an endlap violation and a minimum area violation, a conventional EDA tool may not correct the minimum area violation by placing a patch centered on the via, due to the minimum spacing violation it may cause. Instead, the minimum area violation may be corrected by the EDA tool placing a patch only in one direction, as shown in FIG. 2D. In this case, the geometries may still violate the endlap design rule.

In yet another example, a minimum area violation may be corrected by a conventional EDA tool placing a patch centered on the via, as shown in FIG. 2E, but the area difference between the patch and original metal geometry may be too small to correct an endlap design rule violation for the same geometries.

In some cases, minimum metal area rules are not violated, because a via is overlapped by a long metal path as shown in FIG. 2F, but the geometries violate an endlap design rule. In these cases, a conventional EDA tool may not automatically correct the endlap violation.

Some metal paths may contain two via cuts near the end of the metal path. In these cases, the end metal overlapping both of the vias may not meet the asymmetrical via enclosure rule, as shown in FIG. 2G. FIG. 2G also illustrates a single via cut in a corner of a metal path that may also violate the endlap rule. In both of these cases, conventional EDA tools may not correct the endlap violations automatically.

Another corner case is illustrated in FIG. 2H. It is a four via array for which the surrounding metal does not violate the minimum area design rule. If an automated technique for correcting endlap violations is not be able to determine a patch direction because of the configuration of the array, this type of violation may be corrected manually.

As previously discussed, an EDA tool may generate the types of violations described above. For example, a routing tool may create them when narrow metal paths are used. Because routing tools may do much of their work as part of an automated flow, the number of endlap violations inadvertently generated may be huge. When these endlap violations happen to coincide with a minimum area violation, they may be corrected as a consequence of the correction of the area violations, in some cases. In other cases, they may not be corrected by an existing automated flow.

Because EDA tools are increasingly relied upon to create design layouts, and because conventional EDA tools do not prevent the creation of certain violations, thousands of violations can be created that must be corrected. Performing a DRC and manipulation of the design layout to correct these violations often requires manual interaction from the designer. Creation of a violation-free design layout becomes a critical, time-consuming process. Due to the complexity of the design and because the place and route design flow can be repeated throughout the design process, manually fixing violations may not be an affordable approach.

SUMMARY

An automated technique may correct design rule violations in a design layout of an electronic circuit which may be represented as a design encoding used in conjunction with design tools as part of the process leading to fabrication of the electronic circuit (e.g. on an integrated circuit or printed circuit board). In particular, asymmetric violations, such as for end metal overlap of vias, may be corrected using directional patches.

In various embodiments, endlap violations of a one layer overlapping another layer in a design layout of an electronic circuit may be automatically identified and corrected by processing one or more design files encoded to represent the detailed design geometries and the relative positioning of each design layer to be used in actual fabrication of the electronic circuit. In one embodiment, a stand-alone EDA tool may comprise program instructions configured to process the encoded design files. In another embodiment, the encoded design files may be processed by a user entering program instructions directly into a computing system through a command-line interface. In other embodiments, a user may implement the techniques described herein by executing various commands of a conventional EDA tool or may configure a batch process to execute these instructions or commands.

In some embodiments, the technique may be applied to correct asymmetric design rule violations for layers of a circuit design, such as a metal layer and a via layer. To correct an endlap violation, a metal patch may be constructed and added to the metal layer encoding to implement expanding the metal path only on the side of the via toward the end of the metal path, according to some embodiments. In some embodiments, constructing a patch to correct an endlap violation may include determining the width, length, starting point, and direction of the patch to correct the violation. Determining the width, length, starting point, and direction of a patch may be done using a geometric construction algorithm, according to some embodiments. A geometric construction algorithm such as this may depend on knowing only the width of the via and a predetermined size factor for geometric construction, and may be used to determine other parameters of the patch, according to various embodiments. The patch may be merged with the metal path containing the endlap violation by editing the encoding of the metal path in the design layout or an encoding of the metal patch may be added to the design layout, according to various embodiments. The metal of the patch, when merged with the original metal path or added to the design layout, may result in the design meeting the applicable endlap design rule for the specific technology and geometry size.

In some embodiments, adding a patch to correct an endlap violation or other asymmetric design violation may include determining if the added patch causes other design rule violations, and if so, removing the added patch. In some embodiments, the design rules specifying the minimum overlap amount for end metal over a via may be different for different metal layers, for different metal path widths, or for different ranges of metal path widths. In such embodiments, different predetermined size factors may be used in the construction of patches to correct different ones of the violations. An automated technique for correcting endlap violations may, therefore, include repeating the flow for violations involving metal paths on different metal layers or on metal paths of different widths, using the corresponding design rules and size factors, according to various embodiments.

BRIEF DESCRIPTION OF THE DRAWINGS

FIGS. 2A-2H illustrate various examples of asymmetric via enclosure design rule violations.

FIGS. 5A-5L illustrate one example of a sequence of geometric constructions for correcting an endlap violation, according to one embodiment.

FIGS. 6A-6K illustrate a second example of a sequence of geometric constructions for correcting an endlap violation, according to one embodiment.

FIGS. 7A-7I illustrate a third example of a sequence of geometric constructions for correcting an endlap violation, according to one embodiment.

Figure 1:
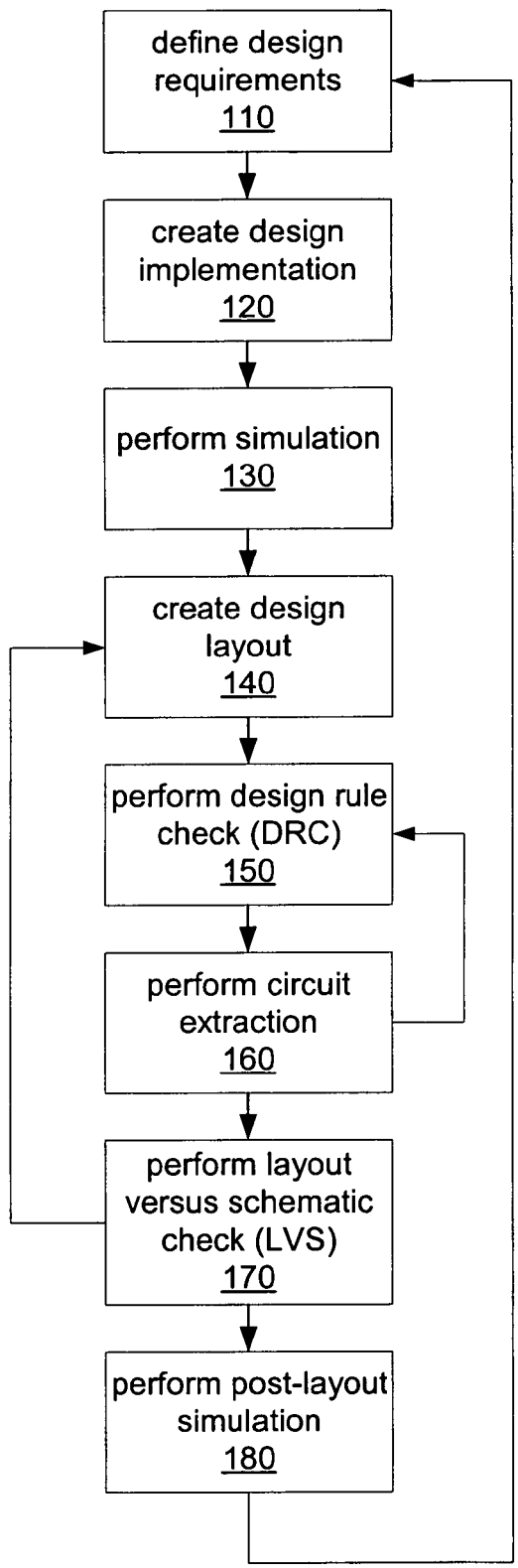
FIG. 1, prior art, illustrates a typical design flow for an integrated circuit device.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

One or more EDA tools may be used to place geometries on various layers of a design layout and to connect them together during creation of the design layout. During a Design Rule Check, or DRC, various design rules may be checked against the design layout. In a modern semiconductor design, it may be desirable to apply different sets of rules to the geometries (i.e., features) on a given layer depending upon their relative size. For example, many design layers, especially those that are used for implementing gates (e.g., polysilicon layers) and wires (e.g., metal layers) may be divided into different classes depending upon their minimum width in any dimension. Objects in different width classes, or ranges, may adhere to different design rules, such as spacing rules, via enclosure rules, and others, to improve wafer fabrication results.

An enclosure check is a common function that is available in most EDA tools performing a DRC. This type of check measures the enclosure of geometries on one layer by geometries on another layer to determine if the minimum enclosure amount is present in the design layout. In advanced technologies, one type of enclosure rule may be an asymmetric enclosure rule, specifying, for example, a different minimum overlap of metal over a via in the direction of the end of the metal path than the minimum overlap of metal on the other sides of the via. These rules are sometimes called endlap rules. Place and route tools may create violations of an endlap rule during generation of a design layout. Some of these violations may be corrected automatically by existing EDA tool functionality as an artifact of correcting other violations, such as minimum area violations. Other violations may not be corrected by the functionality of existing EDA tools.

As used herein, the following nomenclature denotes design layout layers, design rules and/or design rule values:

Mi refers to any metal layer. When i is a number, it specifies a particular metal layer. For example, M1 refers to metal1 and M2 refers to metal2.

Vx refers to any via layer. When x is a number, it specifies a via or via layer for connecting the specified landing layer (x) to another layer. For example, V1 refers to a via cut that will connect landing layer metal1 with an upper, or covering, design layer.

VxWidth refers to the minimum width allowed for a geometry on a via layer, where x specifies the landing layer for the connection made by the via, as described above.

MiWidth refers to the minimum width allowed for a path on a metal layer, where i specifies the particular metal layer.

MiToMi refers to the minimum spacing allowed between geometries on metal layers, where each i specifies the particular metal layer(s).

Mi Wide refers to the minimum metal path width on metal layer i for a metal path in a wide class range.

MiToMiWide refers to the minimum spacing allowed between geometries on metal layers, where at least one of the metal paths is in a wide class range.

MiSideOverVx refers to the minimum allowed overlap of a geometry on a metal layer enclosing a geometry on a via layer on the sides nearest the sides of the metal path, where i specifies the metal layer and x specifies the via layer being enclosed.

MiEndOverVx refers to the minimum allowed overlap of a geometry on a metal layer enclosing a geometry on a via layer on the side nearest the end of the metal path, where i specifies the covering layer and x specifies the landing layer connected by the via.

MiVxWide refers to the minimum width allowed for a metal path of a wide metal class containing a via, where i specifies the metal layer and x specifies the via layer.

It should be understood that the design rules, definitions, and nomenclature used herein are given by way of example only and that one skilled in the art would readily understand that other design rules, definitions, and nomenclature may be used to illustrate the techniques and methods described.

As described above, an electronic circuit design layout is typically implemented as one or more design files encoded to represent the detailed design geometries and the relative positioning of each design layer to be used in fabrication of the electronic circuit. Design Rule Check (DRC) may be performed by processing the design files to compare the geometries encoded in the files against a set of layout design rules. DRC may be performed by executing program instructions configured to compare the geometries encoded in the design files against a set of layout design rules. These program instructions may be executed by a stand-alone EDA tool, by a user executing command-line instructions, or by a user or batch process executing commands of an EDA tool, according to various embodiments.

Correction of DRC violations may involve editing or otherwise processing the encoded layout design files to change the size or shape of a geometry, or to add or delete a geometry, on one or more layers of the design layout, according to various embodiments. For example, if a design layout contains a geometry on a first layer that violates a rule specifying the minimum overlap of that geometry over a geometry on a second layer, correction of the violation may comprise editing a design layout file to change the description of the first layer geometry to extend the overlap and meet the minimum overlap design rule.

In a more specific example, if a metal path in a design layout of an electronic circuit violates an asymmetric via enclosure (endlap) rule, it may be corrected by an automated technique that processes the design layout file representing the electronic circuit and adds an encoding to the file representing an additional metal shape (patch), according to some embodiments. To correct the endlap violation, the metal patch may be placed over the metal violating the endlap design rule to extend the overlap by editing the design file to specify the dimensions and location (coordinates) of the added patch, according to various embodiments. In some embodiments, the patch may be merged with the original metal geometry, if it corrects the violation, by editing the representation of the metal path to extend it over the via in the direction of the end of the path according to the dimensions and coordinates of the patch. If the patch causes a violation of another design rule, such as a metal spacing rule or a jog rule, its encoding may be removed from the design file or another method may be used to correct the resulting design rule violation.

Figure 3:
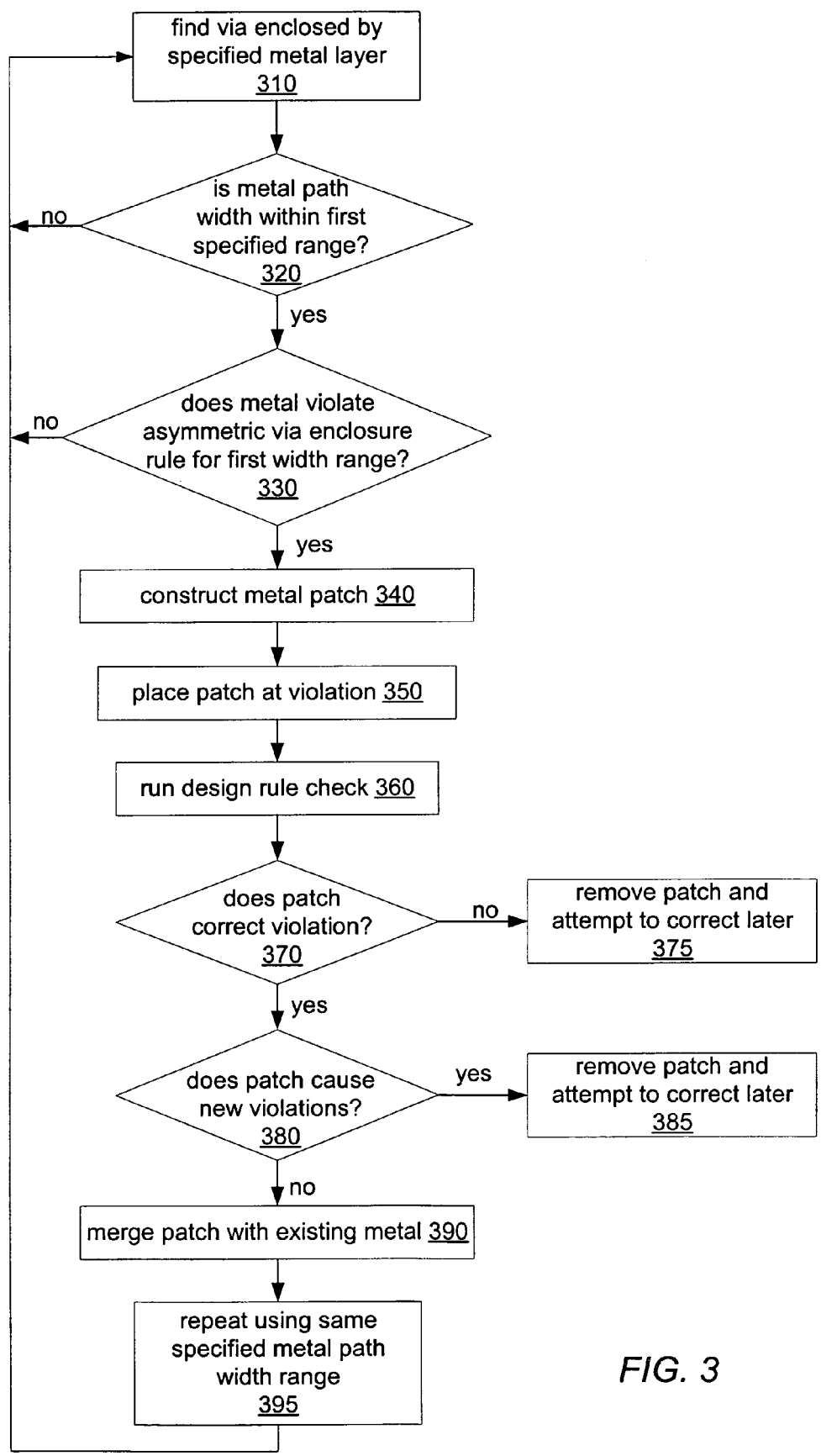
FIG. 3 is a flowchart illustrating one embodiment of an automated technique for correcting endlap violations on metal paths having widths in a first width range.

One embodiment of an automated technique for correcting violations of asymmetric enclosure rules is illustrated by FIG. 3. Although this example describes correction of a violation of an endlap rule for metal overlapping a via, the technique described herein may be applied to other asymmetric enclosure rule violations for any first layer geometries overlapping any second layer geometries having corresponding asymmetric design enclosure rules.

In some embodiments, an automated technique for correcting endlap violations may operate on individual violations of specific endlap design rules one at a time, processing the design files encoding the design layout separately for each endlap design rule associated with the technology to be used to fabricate the electronic circuit represented by the design layout and for each violation of each endlap design rule. In such embodiments, the automated technique may include identifying violations of specific endlap design rules. As illustrated by blocks 310-330, identifying violations of specific endlap design rules may involve filtering out all the vias that are not subject to a particular endlap rule.

For example, all vias that are enclosed by a specified metal layer may be identified, one at a time, as illustrated by block 310. Because a design layout may comprise more than one metal layer containing vias and each metal layer may have its own corresponding endlap design rules, filtering out the vias on all but one metal layer may be used to identify geometries to which a specific endlap design rule applies. Identifying vias enclosed by a specified metal layer may involve executing program instructions configured to parse the design files encoding the design layout to identify specific metal geometries overlapping vias, in some embodiments.

Similarly, an automated technique for correcting endlap violations may include filtering the vias to exclude vias that are not enclosed by a metal path in a specific width range, as in block 320, in some embodiments. As previously described, advanced technologies may define multiple width classes for metal features used in a design layout, and each metal width class, or range, may have different via enclosure design rules. Filtering out vias enclosed by metal paths having widths other than in a first specified width range may be used to identify geometries to which a specific endlap design rule applies, in some embodiments. Filtering out vias in different width ranges may involve executing program instructions configured to parse the design files encoding the design layout to identify geometries on the specified metal layer with widths in specified width ranges, one at a time, in some embodiments.

Subsequent to identifying a via enclosed by a metal path on a specified metal layer and in a specified width range, the via and metal path geometries may be compared to the corresponding endlap design rule, in some embodiments. If the metal path violates the endlap design rule, as in 330, the automated technique for correcting endlap violations may attempt to correct the violation.

Once an endlap violation is identified, a metal patch may be constructed to attempt to correct the violation, as illustrated at 340. Constructing a patch may, according to various embodiments, include determining the width of the metal path at the location of the violation and using it as the patch width, determining the appropriate patch length, determining the patch starting edge, and determining the patch direction so that the endlap violation will be corrected when the patch is placed at the starting edge and in the direction toward the metal path end. Using the metal path width as the patch width may, in some embodiments, prevent the patch from creating an unnecessary jog in the metal path when placed to correct the endlap violation. Similarly, if the patch is no bigger than it needs to be to correct the violation, the probability of the patch causing a spacing violation may be reduced, and the rate of successful endlap corrections may, in some embodiments, be increased.

Figure 4:
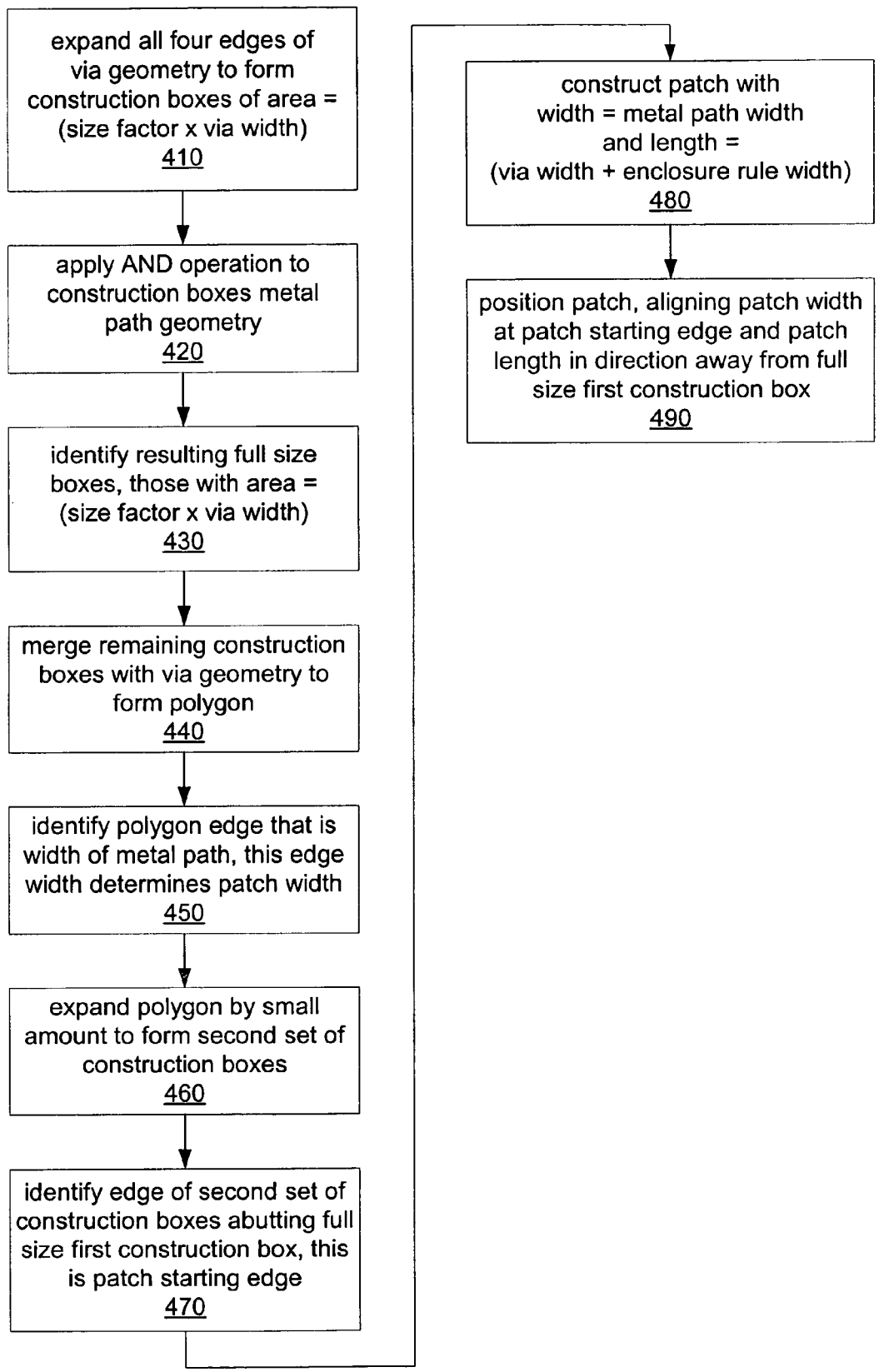
FIG. 4 is a flowchart illustrating a geometric construction algorithm for correction of endlap violations, according to one embodiment.

Determining the appropriate dimensions and location of a metal patch that may be used to correct an endlap violation may be difficult given the limited information available in the design files encoding the design layout. However, in some embodiments, the automated technique for correcting endlap violations may include a method for constructing patches to correct endlap violations using this limited information. A geometric construction algorithm may, in some embodiments, be one of the methods used to process the geometries encoded in the design files representing the design layout and to determine the appropriate dimensions and location for such metal patches. One embodiment of a geometric construction algorithm for constructing such metal patches is illustrated by FIG. 4, and described in further detail below.

Once a metal patch is constructed, it may be placed at the violation to correct it, as at 350, by editing the design file encoding the design layout, in some embodiments. Placing the patch may comprise adding, to the file, an additional encoding of a metal geometry (the patch) on the specified metal layer, having the dimensions and coordinates determined by the geometric construction algorithm described below.

Subsequent to a patch being added to the design file, a design rule check (DRC) may be run on the resulting design, as illustrated at 360. Running a DRC on the design may comprise processing the design files encoding the design layout to compare the geometries encoded in the files, including the added metal patch geometry, against a set of layout design rules. As previously described, DRC may be performed by executing program instructions configured to compare the geometries encoded in the design files against a set of layout design rules. These program instructions may be executed by a stand-alone EDA tool, by a user executing command-line instructions, or by a user or batch process executing commands of an EDA tool, according to various embodiments.

In some embodiments, the DRC may be used to determine if the added metal patch corrected the endlap violation, as in 370. If the patch extended the metal overlap of the via enough to meet the minimum via enclosure design rule, the violation may be corrected. If the patch did not extend the metal overlap of the via enough to meet the minimum via enclosure design rule, the patch may be removed, as in 375. Removing the patch may comprise editing the design file encoding the design layout to remove the encoded description of the patch geometry on the specified metal layer, in some embodiments.

In some embodiments, if the DRC determines that the metal patch corrected the endlap violation, the resulting design may be checked against other design rules. In this example, shown in 380, if the patch corrected the endlap violation but caused additional design rule violations, such as a violation of a minimum metal spacing rule, the patch may be removed. Again, removing the patch, as in 385, may comprise editing the design files encoding the design layout to remove the encoded description of the patch geometry on the specified metal layer, in some embodiments.

In this example, if the patch is removed because it did not correct the endlap violation or because it caused additional design rule violations, the automated technique for correction of endlap violations may be used to attempt to correct the endlap violation in a later pass, or another method may be used to correct the endlap violation, according to some embodiments. This is illustrated at 375 and 385 of FIG. 3.

If the patch corrected the endlap violation and did not cause additional design rule violations, it may be merged with the surrounding metal to be included in the production design layout, in some embodiments. Merging the patch with the surrounding metal may be performed by editing the encoded representation of the metal path to extend it over the via in the direction of the end of the path according to the dimensions and coordinates of the patch, as in block 390. In other embodiments, the metal patch may remain a separately encoded geometry on the metal layer in the design layout.

The automated technique for correcting endlap violations illustrated by FIG. 3 may be repeated until correction is attempted for all endlap violations involving metal paths on the specified metal layer and having width in the first specified width range, according to various embodiments. If all the identified endlap violations are not corrected, other methods may be used to correct the remaining violations. In some embodiments, one or more of the remaining endlap violations may be corrected by manually editing the design files encoding the design layout using a text editing program, or by editing the shapes and sizes of geometries of the design layout using an EDA tool configured to graphically edit the layout design.

As previously described, an automated technique for correcting endlap violations may utilize a geometric construction algorithm to determine the location, size, and direction of patches to correct endlap design rule violations, in some embodiments. For example, a geometric construction algorithm may be used to determine the parameters for constructing such a patch using geometric operations applied to the metal and via geometries involved in the violation. In some embodiments, use of the geometric construction algorithm may be optimized when metal paths in the vicinity of the violations meet applicable minimum metal spacing design rules.

A geometric construction algorithm, as described above, may use two known values to derive other information for constructing and placing a metal patch for correcting an endlap violation, according to some embodiments. In one embodiment, the via width may be known and a geometric construction size factor may be predetermined. The predetermined size factor used by the geometric construction algorithm may have different values when the geometric construction algorithm is applied to correct different endlap violations, according to various embodiments. In some embodiments, the starting point, direction and size to apply a patch may be determined from just the via width and size factor for a particular endlap violation.

An exemplary embodiment of a geometric construction algorithm for constructing and placing a patch to correct an endlap violation is illustrated by the flowchart in FIG. 4. This algorithm may be implemented by executing program instructions configured to process the design files encoding the design layout of an electronic circuit design. The program instructions may, in some embodiments, be executed as a stand-alone EDA tool, by a user executing command-line instructions, or by a user or batch process executing commands of an EDA tool, according to various embodiments. In this example, program instructions configured to implement the geometric construction algorithm are configured to perform geometric operations on the design layout geometries (shapes) represented by the encodings in the design files. In one embodiment, these operations may be performed by a user executing command-line instructions configured to process the design files directly, or by a user executing a batch process to process the design files directly. In another embodiment, these operations may be performed graphically by a user executing built-in or custom commands of an EDA tool, for example a design layout editing tool, or by executing one or more built-in or custom macro functions within an EDA tool. The technique may be implemented by a separate utility that operates on a design file produced by an EDA tool, or the technique may be implemented as part of the EDA tool or another tool.

One embodiment of a geometric construction algorithm that may be used to construct and place a patch to correct an asymmetric enclosure violation is illustrated by FIG. 4. In this example, the geometric construction algorithm may be used to determining the patch dimensions, starting point and the patch direction. The example is further illustrated by FIGS. 5A-5L, which depict the operations performed on the via and metal geometries to correct an endlap violation. Although this example illustrates correction of an "end metal enclosure of via" rule violation, the techniques and algorithms described herein may be applied to other asymmetric enclosure rule violations for geometries of one layer overlapping geometries of another layer having corresponding asymmetric design enclosure rules.

A geometric construction algorithm for correction of the example endlap violation illustrated in FIG. 5A, is depicted in FIGS. 5B-5L and described herein with reference to FIG. 4. In this example, a geometric operation is performed, at 410, to expand all four edges of the via by a predetermined first size factor to form four construction boxes. Expanding the via may comprise editing the encoding representing the via geometry in the design file for the design layout and changing the dimensions of the via, increasing them by the amount specified by the predetermined first size factor, in some embodiments. This operation may be performed by editing the encoding for the via itself, or by editing a temporary copy of the encoding, or portion of the encoding, of the via for use by the geometric construction algorithm.

In one embodiment, guidelines for determining the first size factor are that it should not be smaller than the value of the endlap design rule and it should not be greater than the minimum metal spacing allowed for metal paths in the corresponding metal class. A rule of thumb may be that the first size factor should leave only one construction box completely inside the metal path. These construction boxes corresponding to the operation of 410 are shown in FIG. 5B. In this example, each box of this first set of construction boxes has an area equal to the width of the via times the first predetermined size factor, and three of the four construction boxes are partially outside the metal path.

If the first predetermined size factor is too small, in some embodiments, the construction box on the side nearest the endlap violation may be still completely inside the metal path, and there may be no clue for finding the starting edge and the patch direction. However, if the first predetermined size factor is not greater than the minimum metal spacing for that metal class, it may guarantee that besides the one construction box in the direction opposite the violation, all other construction boxes will go outside the metal path but never touch another metal object, according to some embodiments.

The geometric construction algorithm may also be used to identify the full size construction box that is completely inside the metal path, as described above. For example, at 420, a Boolean AND operation may be performed on the construction boxes and the metal path, as further illustrated by FIG. 5C. The result of the AND operation, in this example, is that only one full size construction box remains, along with three smaller boxes. The one full size construction box remaining, in the example, is the one that is completely inside the metal path. Again, this operation, a Boolean AND, may be implemented by editing the design files or copy thereof encoding the design layout, or by executing built-in or custom command-line or graphical instructions of an EDA tool, according to various embodiments.

In some embodiments, the geometric construction algorithm may be used to locate the one full size construction box, which is shown in FIG. 5D, in order to continue construction of a metal patch. For example, block 430 described that the full size construction box may be located. Although the exact size of the three partial boxes may not be known, the geometric construction algorithm may calculate the full size box area, which is the width of the via times the predetermined size factor, or (VxWidth*SizeFactor). The geometric construction algorithm may then use this information to derive other information for constructing and placing a patch.

Subsequent to identifying the full size construction box, in this example, the three partial boxes may be merged with the via geometry to form a polygon, as described by block 440 and illustrated by FIG. 5E. This merging may be implemented by performing a Boolean OR operation on the geometries, for example, by editing the design files encoding the design layout, or by executing built-in or custom command-line or graphical instructions of an EDA tool, according to various embodiments.

In this example, one edge of the polygon that is equal in length to the width of the metal path may be identified, as in 450. The rest of the edges will either be equal to the via width or smaller than the first predetermined size factor. In this example, the width of the patch will be equal to the length of this identified edge.

In order to identify the edge described above, in one example, the merged polygon edges may be expanded outward by a second predetermined size factor, as in block 460 and as illustrated by FIG. 5F. The second predetermined size factor may be much smaller than the first size factor. In some embodiments, this second size factor may be proportional to a design layout grid size. A design layout grid size may be used by layout designers drawing geometries using a layout design editing tool, and by automated layout design tools, such as place and route tools, for aligning the geometries and layers of a design layout. In one example, the second size factor may be equal to one-tenth of this design layout grid size. This expansion results in a second set of construction boxes, shown in FIG. 5F. Again, expansion of the merged polygon may be implemented by editing the design files encoding the design layout, or by executing built-in or custom command-line or graphical instructions of an EDA tool, according to various embodiments, and the merged polygon may be formed by editing the encoding for the via or by editing a temporary copy of the via on a construction layer of the design layout.

One of the second set of construction boxes must overlap the full size construction box created by the first expansion, at 420, in this example. The polygon edge that abuts the full size construction box may be identified, as described by block 470, and illustrated by FIG. 5G. This edge is the one corresponding to the second construction box that overlaps the full size construction box. In this example, the identified polygon edge will be the patch starting edge. The length of this edge will also be equal to the patch width.

In some embodiments, an existing feature of an advanced EDA tools, such as a physical verification tool, may be used to select an edge from a shape that is abutting or coincident with another shape. For example, Calibre™, an EDA tool from Mentor Graphics Corporation, includes a built-in function to select a complete edge from a shape when it is abutting or coincident with another shape. In embodiments implemented using this tool, the geometric correction algorithm may be simplified. For example, since the merged polygon must be abutting the only full size edge construction box as shown in FIG. 5G, the edge corresponding to the starting of the patch, as shown in FIG. 5H, may be found using the built-in functionality of the tool, rather than by expansion of the merged polygon to form a second set of construction boxes.

The length of the metal patch, in this example, may be calculated to be the via width plus the asymmetric via enclosure rule, or (VxWidth+MiEndOverVx). Using the geometric construction algorithm described herein, this patch length may result in constructing the shortest metal patch that may be used to correct an endlap violation, because it results in the metal patch extending over the via by the minimum allowed overlap, according to the endlap design rule.

In this example, once the patch width and length are calculated, the geometric construction algorithm may be used to construct a patch on the metal layer at the location of the violation, as in 480. The patch may be constructed by editing the design file encoding the design layout to add an additional geometry of the calculated dimensions to the specified metal layer, or by adding the patch geometry to a temporary construction layer, according to various embodiments.

In this example, the geometric construction algorithm may also be used to determine the direction to place the patch with respect to the determined patch starting edge. Since the starting edge is abutting the full size construction box, it must be on the via edge opposite from the edge involved in the violation. Thus, in this example, the patch direction will be the direction away from the full size construction box, as shown in FIG. 5H.

Positioning the metal patch over the violation to correct it, as in 490, may include editing the design file encoding the design layout to specify the location, or coordinates, of the patch according to the determined starting edge and patch direction. Again, this may be done by editing the encoding of the metal layer itself to add a patch or to extend the existing metal path, or by editing the encoding of the patch on a temporary construction layer of the design layout. Graphically, positioning the patch is illustrated in FIGS. 5I and 5J.

Subsequent to the positioning of the metal patch, the construction boxes used during the execution of the geometric construction algorithm may be removed, as shown for this example in FIG. 5K. Removing the construction boxes may comprise editing the design file encodings for the via and metal path to delete the results of the expansion, AND, and OR operations performed at 410, 420, 440, and 460, in some embodiments. If temporary construction layers were used for these constructions, the encodings for the construction boxes may be deleted or may remain in the design files, according to various embodiments. If various operations of the geometric construction algorithm were implemented using instructions of an EDA tool, such as a graphical layout editing tool, the construction boxes may be deleted using other instructions of the tool, in some embodiments.

The patch constructed and placed using the geometric construction algorithm may be merged with the surrounding metal path, as illustrated in FIG. 5L, or it may remain a separate geometry on the metal layer in the encoded design files representing the design layout, according to various embodiments. If the patch was constructed on a temporary construction layer, as in some embodiments, it may be merged with the specified metal layer to be included in the production metal layer prior to fabrication of the electronic circuit, as described above with respect to 390.

In some embodiments, the automated technique for correcting endlap violations may include performing a minimum metal spacing check and removing any patches that caused a metal spacing violation. This spacing check may be repeated for different metal width ranges, in some embodiments.

In some embodiments, endlap violations located near a corner of a metal path, such as illustrated in FIG. 6A, may also be corrected using the same basic geometric construction algorithm described above. In such embodiments, as described herein with respect to FIGS. 6A-6K, the geometric construction algorithm may iterate on some operations in order to correct the endlap violation.

In applying the algorithm described above to a corner case, in some embodiments, the geometric construction algorithm may include the same operations as in 410 and 420 described above. For example, the via of FIG. 6A is expanded by a first predetermined size factor, as shown in FIG. 6B. Then a Boolean AND is performed on the resulting construction boxes and the metal path, as shown in 6C.

At 430, however, because the via is close to one metal side edge and one metal path end edge, more than one full size construction box may be identified, in some embodiments. When there are two full size construction boxes, as illustrated in FIG. 6D, the starting edge and direction of the patch may not be discernable. The geometric construction algorithm may resolve the uncertainty as described below in some embodiments.

In this example, for those constructions that result in more than one full size construction box, the geometric construction algorithm may be used to find the via edges that are abutting the two full size construction boxes and leave the remaining partial construction boxes for a later operation, as shown in FIG. 6D.

In this example, the two found via edges may be expanded by a predetermined size factor larger than the first predetermined size factor used in 410. Because more than one full size construction box was created at 430, the metal width must be in a wider metal class than the metal class associated with the first predetermined size factor. Thus, the size factor for this second phase may be equal to the value of a minimum metal spacing rule plus the value of a different minimum metal spacing rule, one corresponding to minimum spacing between a metal path in a first metal width range and a metal path in a second, wider, metal path width range, or (MiToMi+MiToMiWide).

The geometric construction algorithm may expand the via width by this new size factor, as shown in this example by FIG. 6E. This may result in one of the two secondary construction boxes extending outside the metal path and leaving only one full size construction box completely inside the metal path.

Once the one full size construction box is identified, in this example, the remaining operations of the geometric construction algorithm described above may be applied to the corner case. An AND operation may be performed on the first construction boxes and the metal, as shown in FIG. 6F.

The three partial construction boxes may be merged to form a construction polygon, as illustrated in this example by FIG. 6G.

In some embodiments, the complete edge in the construction polygon that is abutting the full size construction box may be identified, as shown in FIG. 6H, and the geometric construction algorithm may use it to determine the patch width and direction as described in various embodiments above.

In this example, the metal patch may be constructed using a calculated patch length, (VxWidth+MiEndOverVx), and the determined patch width, to form the patch. The patch may be positioned by aligning it at the determined starting edge and extending it in the determined direction, as illustrated in this example, by FIG. 6I.

As described above, any construction boxes may be removed, as illustrated by FIG. 6J and the patch may be merged with the surrounding metal, as shown in FIG. 6K, in this example. Similarly, any construction boxes, or the patch, constructed on temporary construction layers may be removed or may remain in the design files encoding the design layout, according to various embodiments.

In some embodiments, the automated technique for correcting endlap violations and geometric construction algorithm presented may also be used to correct multiple endlap violations located near each other, such as those illustrated in FIG. 7A. In this example, two via cuts at one end of a metal path are spaced the minimum allowed distance apart and both are violating the endlap rule. In some embodiments, the two via cuts may be merged into one temporary via construction and then the same geometric construction algorithm described above may be used to correct both endlap violations at once. This example is illustrated by FIGS. 7A-7I and described below.

A geometric operation may be used to expand the vias by one-half the value of minimum via-to-via spacing (VxToVx/2) on all four edges. This expansion may comprise editing the encoding representing the via geometries in the design file for the design layout and changing the dimensions of the vias, increasing them by (VxToVx/2), in some embodiments. This operation may be performed by editing the encoding for the vias themselves, or by editing a temporary copy of the encoding of the vias for use by the geometric construction algorithm, according to various embodiments.

In this example, another geometric operation may be used to size the non-abutting/overlapping edges of the expanded via geometries back down by the same amount (VxToVx/2) to merge the close via cuts together as shown in FIG. 7B. Again, this operation may comprise editing the encoding representing the merged via geometry in the design file for the design layout and changing the dimensions of the via, decreasing it by (VxToVx/2) in three directions, in some embodiments. This operation may be performed by editing the encoding for the merged via on the via layer itself, or by editing a temporary copy of the encoding of the merged via used by the geometric construction algorithm, according to various embodiments. Once the vias are merged, in this example, the merged via cut may be treated as a single via cut and the geometric construction algorithm may proceed as previously described.

In this example, the merged via may be expanded by a predetermined size factor equal to the minimum metal to metal spacing rule to form four construction boxes, as illustrated by FIG. 7C. Three construction boxes will extend partially outside the metal path.

In this example, an AND operation may be performed on the construction boxes and the metal, as shown in FIG. 7D, resulting in one full size construction box completely inside the metal path and three partial construction boxes, as illustrated by FIG. 7E.

The three partial construction boxes may be merged with the merged via to form a construction polygon as shown in 7F, in this example. The complete edge in the construction polygon that is abutting the full size construction box may be identified and the geometric construction algorithm may use it to determine the patch width and direction as described above.

In this example, the identified polygon edge may be expanded by an amount equal to the via width plus the endlap rule amount (VxWidth+MiEndOverVx) to form a patch. The patch may be placed over the violation, aligning the patch at the determined starting edge and extending in the determined direction, as illustrated in FIG. 7G.

In this example, the construction boxes may be removed, as illustrated by FIG. 7H and described above. In some embodiments, the patch may be merged with the surrounding metal, as shown in FIG. 7I.

As described above, design rules are typically different for different sized geometries. For example, larger spaces may be required between large geometries than those required between smaller geometries. Because design rules are typically different for different sized geometries, geometries are often classified according to size. In some technologies, a design layout may have multiple metal width ranges, or classes, defined. Design rules may be applied to each metal width range individually, resulting in a much more optimal layout.

Enclosure rules, and more specifically, asymmetric via enclosure rules, are typically specified by metal width range. That is, the minimum amount of end metal overlap required varies according to the width of the metal path. According to various embodiments, multiple passes of an automated technique for correcting endlap violations may allow the flow to correct endlap violations involving metal paths of multiple metal width classes. By setting different predetermined size factors for each metal width range, in some embodiments, the flow may iterate to correct violations in metal paths of different width ranges.

Figure 8:
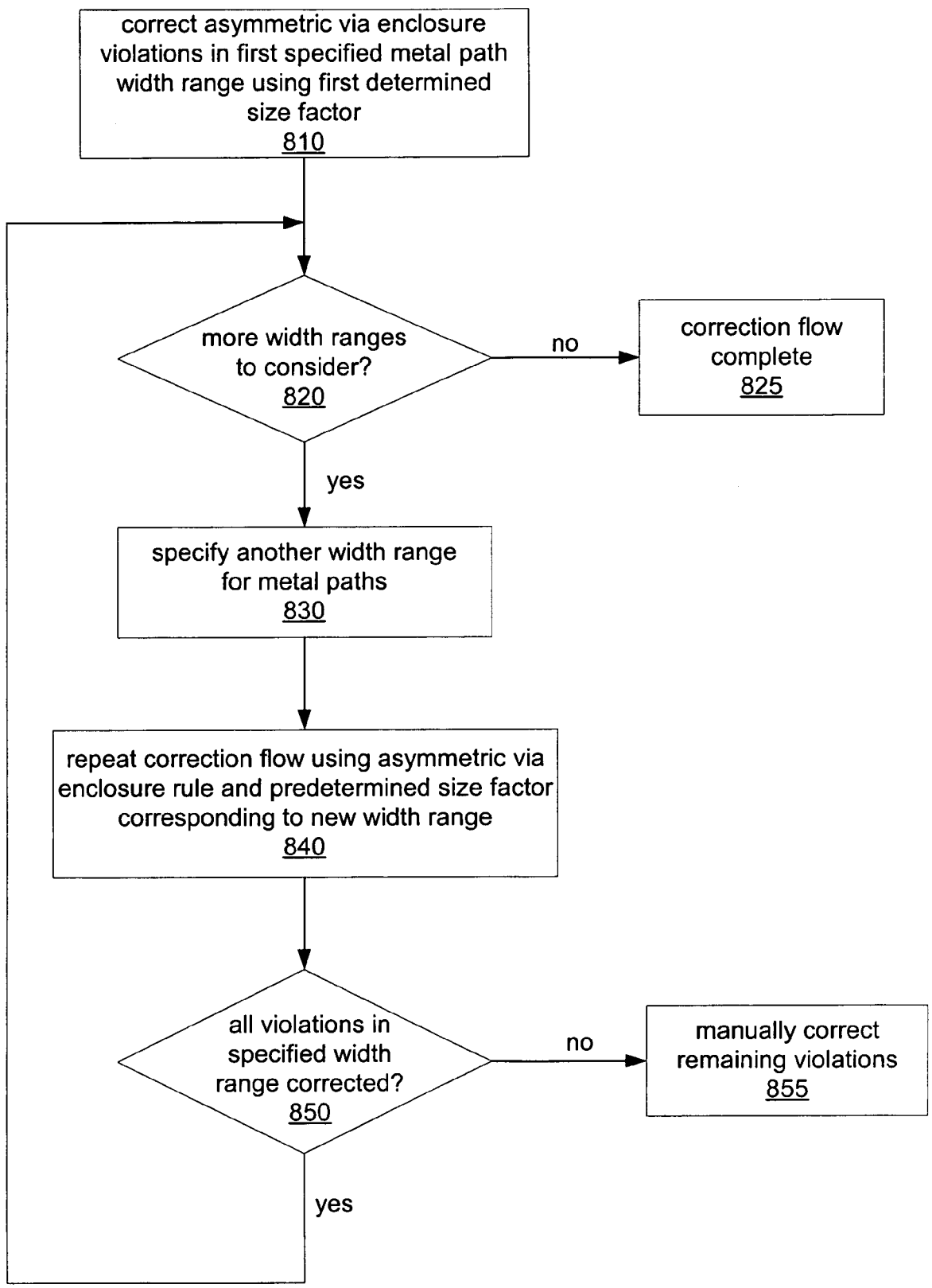
FIG. 8 is a flowchart illustrating one embodiment of an automated technique for correcting endlap violations on metal paths having widths in multiple width ranges.

One such embodiment is illustrated by the flowchart in FIG. 8. In this example, at 810, endlap violations for geometries on a metal path in a first width range may be corrected using an automated technique for correcting endlap violations and a geometric construction algorithm, such as those illustrated by FIGS. 3 and 4 and described above.

In this example, the automated technique for correcting endlap violations may implement determining if there are additional width ranges defined to which different endlap violations apply, as in 820. This may be done by executing program instructions configured to parse a file comprising encodings of design rules associated with the technology in which the electronic circuit may be fabricated and to search for such definitions and design rules.

If there are no other metal width classes defined for which endlap design rules are specified, the automated technique for correcting endlap violations may be complete, as illustrated by block 825. If, however, there are other width ranges to consider, processing may continue at 830, in which a second width range is specified.

An automated technique for correcting endlap violations, such as the one illustrated by FIG. 3, may be repeated in an attempt to correct endlap violations for metal paths in the second width range, as described by block 840. Because the design rules corresponding to metal paths in the second width range may be different than the design rules corresponding to metal paths in the first width range, the geometric construction algorithm described above with respect to FIG. 4 may use a different predetermined size factor when constructing and placing patches over endlap violations in this range of metal path widths.

At 850, in this example, the automated technique for correcting endlap violations may determine if the geometric construction algorithm corrected all endlap violations on metal paths in this second width range. This may be done by performing a DRC, as previously described. If any of the identified endlap violations have not been corrected, as in block 855, they may be corrected manually or using other methods, according to various embodiments.

In this example, if more than two metal path width ranges are specified for a given technology, the automated technique for correcting endlap violations may be repeated for additional metal path width ranges using corresponding design rules and predetermined size factors, as illustrated by block 850. Repeating the automated techniques for correcting endlap violations may comprise automatically executing program instructions configured to implement automated correction of endlap violations multiple times until attempts have been made to correct all endlap violations on all metal layers and in all metal path width ranges, in some embodiments. In other embodiments, a user may invoke execution of the program instructions using a command-line directive specifying the metal layers and/or metal path width ranges to be used by the automated techniques. In still other embodiments, invoking the automated techniques for correcting endlap violations on multiple metal layers and in multiple metal path width range may be done using graphical commands executed within an EDA tool.

Once the operations at 830-850 are repeated for all applicable metal width ranges, design rules, and size factors, the automated technique for correcting endlap violations may be completed, as shown at 825.

While the above embodiments have been described in relation to asymmetric design rules for metal enclosure of vias, the techniques described herein may, taken together or in part, be applicable to correction of other asymmetric design rules, such as enclosure rules for other overlapping geometries, or path end spacing rules for metal or other design layers. For example, the techniques described herein for determining the direction of a path end versus a path side, the starting point of a patch, the width of a patch, or the length of a patch may be applicable to methods for correcting other DRC violations.

Figure 9:
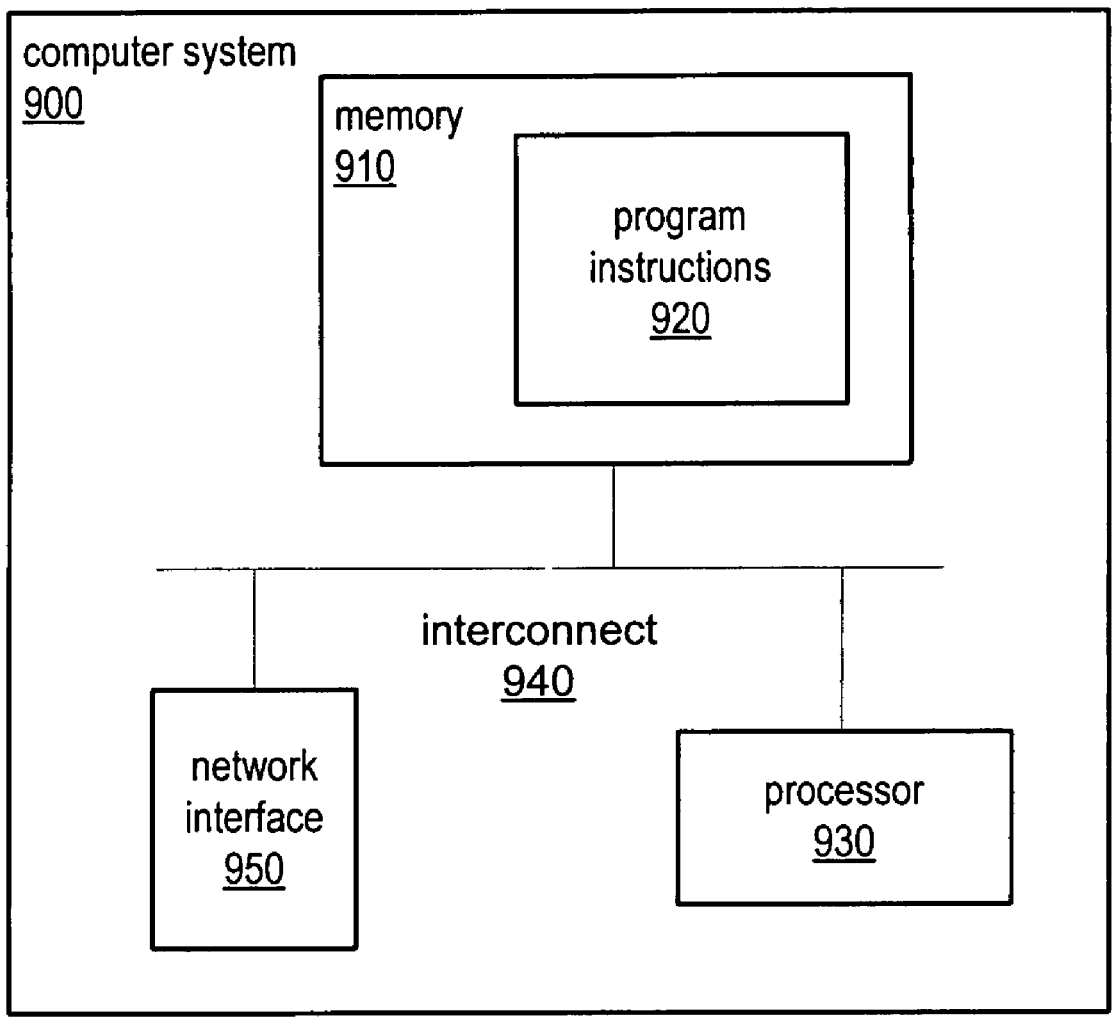
FIG. 9 illustrates an exemplary computer system capable of implementing an automated technique for correcting asymmetric enclosure design rules, according to one embodiment.

In some embodiments, program instructions may be configured to implement an automated technique for correcting asymmetric enclosure design rules. FIG. 9 illustrates a computing system capable of implementing an automated technique for correcting endlap violations, as described herein and according to various embodiments. Computer system 900 may be any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc., or in general any type of computing device.

Computer system 900 may include at least one processor 930. Processor 930 may couple across interconnect 940 to memory 910. Memory 910 is representative of various types of possible memory media, also referred to as "computer accessible media." Hard disk storage, floppy disk storage, removable disk storage, flash memory and random access memory (RAM) are examples of memory media. The terms "memory" and "memory medium" may include an installation medium, e.g., a CD-ROM or floppy disk, a computer system memory such as DRAM, SRAM, EDO RAM, SDRAM, DDR SDRAM, Rambus RAM, etc., or a nonvolatile memory such as a magnetic media, e.g., a hard drive or optical storage. The memory medium may include other types of memory as well, or combinations thereof.

In some embodiments, memory 910 may include program instructions 920 configured to implement automated correction of asymmetric enclosure design rule violations as described herein. In certain embodiments memory 910 may include program instructions configured to implement an automated technique for correcting endlap violations as described herein. An automated technique for correcting endlap violations may be implemented in any of various programming languages or methods, according to various embodiments.

It should be appreciated that although embodiments described herein include techniques executed by software modules, operations discussed herein may consist of directly entered commands by a computer system user, such as a user of computer system 900, in some embodiments. The functionality of step referred to herein may correspond to the functionality of modules or portions of modules, according to various embodiments. In addition to software modules, the above flows or portions of flows may, in some embodiments, be implemented as application instructions or menu items. For example, an operation that expands edges of design layout geometry by a predetermined size factor, as described herein, may be an application instruction provided by an EDA tool provider, according to some embodiments.

The operations referred to herein may be modules or portions of modules (e.g., software, firmware, or hardware modules), according to various embodiments. For example, the software modules discussed herein may include script, batch or other executable files, or combinations and/or portions of such files. In some embodiments, the software modules may include a computer program or subroutines thereof encoded on computer accessible media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention, according to various alternate embodiments.

Thus, the flows described herein, the operations thereof and modules therefore may be executed on a computer system configured to execute the operations of the flows and/or may be executed from computer accessible media, according to various embodiments. In some embodiments, the flows may be embodied in a machine-readable and/or computer accessible medium for configuring a computer system to execute the flows. Thus, the software modules may be stored within and/or transmitted to a computer system memory to configure the computer system to perform the functions of the module, according to various embodiments.

The flows described herein may be applied to an entire design layout or portions thereof, according to various embodiments. For example, applying a flow to a smaller portion of a design layout may be performed to improve EDA tool performance, or as portions of the design layout are completed, or when only a portion of the design layout needs an increased density, or any other similar reason.

Although the above embodiments have been described in relation to several specific EDA tools, the techniques described herein may be applicable to and make use of any EDA tools or electronic circuit layouts, and implemented in any code language, according to various embodiments. Moreover, although the above embodiments have been described in relation to integrated circuit layouts, the techniques described herein may be equally useful in the layout of other electronic devices, for example in a layout of a printed wiring board, in some embodiments.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A computer implemented method, comprising:
identifying a violation of a first asymmetric enclosure design rule for a geometry on a first layer of an electronic circuit design layout enclosing a geometry on a second layer of the electronic circuit design layout, wherein the width of the geometry on the second layer is known;
determining a patch width from a geometric expansion of each edge of the geometry on the second layer by a first predetermined size factor and using the known width of the geometry on the second layer;
determining a patch starting edge from the geometric expansion;
determining a patch direction based on the determined patch starting edge and the geometric expansion;
determining a patch length, wherein determining the patch length comprises adding the known width of the geometry on the second layer to the first asymmetric enclosure design rule;
constructing a patch on the first layer according to the determined patch width, the determined patch starting edge, the determined patch direction, and the determined patch length.

2. The method of claim 1, wherein determining a patch width comprises:
expanding the geometry on the second layer in four directions by the first predetermined size factor to form four construction boxes;
applying a Boolean AND operation on the construction boxes and the geometry on the first layer;
identifying a resulting full size construction box, wherein the full size construction box has an area equal to the first predetermined size factor times the known width of the geometry on the second layer;
merging all construction boxes other than the full size construction box with the geometry on the second layer to form a polygon;
identifying an edge of the polygon having length equal to a width of the geometry on the first layer at the location of the polygon edge; and
determining the width of the geometry on the first layer at the location of the polygon edge.

3. The method of claim 2, wherein determining a patch starting edge comprises:
expanding the polygon by a second predetermined size factor on each edge to form a second set of construction boxes, wherein the second predetermined size factor is less than the first predetermined size factor; and
identifying an edge of the second set of construction boxes abutting the identified full size construction box.

4. The method of claim 2, wherein determining a patch direction comprises selecting a direction away from the determined patch starting edge and opposite the direction of the full size construction box.

5. The method of claim 2, wherein determining a patch starting edge comprises identifying an edge of the polygon abutting the full size construction box using a function of an electronic design automation tool.

6. The method of claim 2, wherein more than one full size construction box is identified subsequent to said applying a Boolean AND operation; further comprising:
repeating said forming, applying, and identifying prior to said merging, wherein the first predetermined size factor is replaced by a third predetermined size factor, and wherein the third predetermined size factor is greater than the first predetermined size factor and not more than the sum of a minimum spacing rule for first layer geometries in the first width range and a minimum spacing rule for first layer geometries in a second, wider, width range.

7. The method of claim 1, wherein said first asymmetric enclosure design rule applies to geometries on the first layer having a width within a first width range.

8. The method of claim 7, further comprising:
identifying a violation of a second asymmetric enclosure design rule of a geometry on the first layer enclosing a geometry on the second layer, wherein the second asymmetric enclosure design rule applies to geometries on the first layer having a width within a second width range; and
repeating said determining an edge, said determining a patch width, said determining a patch direction, said determining a patch length, and said constructing a patch for the violation of the second asymmetric enclosure design rule.

9. The method of claim 1, further comprising:
determining if the patch causes additional design rule violations;
merging the patch with the geometry on the first layer if it is determined not to cause additional design rule violations; and
removing the patch if it is determined to cause additional design rule violations.

10. The method of claim 1, wherein the violation comprises a violation of minimum end metal enclosure of a via.

11. The method of claim 1, wherein the predetermined size factor is not less than the asymmetric enclosure design rule and not more than a minimum spacing rule for geometries on the first layer.

12. The method of claim 1, wherein a plurality of violations of the first asymmetric enclosure design rule for a geometry on a first layer of an electronic circuit design layout enclosing a geometry on a second layer of the electronic circuit design layout are identified, further comprising merging the geometries on the second layer prior to said determining a patch width, determining a patch starting edge, determining a patch direction, determining a patch length, and constructing a patch on the first layer.

13. A system, comprising:
a processor;
a memory, wherein the memory comprises program instructions executable by the processor to:
identify a violation of a first asymmetric enclosure design rule for a geometry on a first layer of an electronic circuit design layout enclosing a geometry on a second layer of the electronic circuit design layout, wherein the electronic circuit design layout is encoded in one or more design files representing the electronic circuit, and wherein the width of the geometry on the second layer is known;
determine a patch width from a geometric expansion of each edge of the geometry on the second layer by a first predetermined size factor and using the known width of the geometry on the second layer;
determine a patch starting edge from the geometric expansion;
determine a patch direction based on the determined patch starting edge and the geometric expansion;
determine a patch length, wherein determining the patch length comprises adding the known width of the geometry on the second layer to the first asymmetric enclosure design rule;
construct a patch on the first layer according to the determined patch width, the determined patch starting edge, the determined patch direction, and the determined patch length.

14. The system of claim 13, wherein the violation comprises a violation of minimum end metal enclosure of a via.

15. A tangible, computer accessible medium comprising program instructions configured to:
access one or more design files for an electronic circuit, wherein the one or more design files comprise encoded representations of a design layout of the electronic circuit;
identify a violation of a first asymmetric enclosure design rule for a geometry on a first layer of the design layout enclosing a geometry on a second layer of the design layout, wherein said first asymmetric enclosure design rule applies to geometries on the first layer having a width within a first width range, and wherein the width of the geometry on the second layer is known;
determine a patch width using a geometric expansion of each edge of the geometry on the second layer by a first predetermined size factor and using the known width of the geometry on the second layer;
determine a patch starting edge using the geometric expansion;
determine a patch direction using the determined patch starting edge and the geometric expansion;
determine a patch length, wherein determining the patch length comprises adding the known width of the geometry on the second layer to the first asymmetric enclosure design rule;
construct a patch on the first layer according to the determined patch width, the determined patch starting edge, the determined patch direction, and the determined patch length.

16. The medium of claim 15, wherein the program instructions are further configured to:
identify a violation of a second asymmetric enclosure design rule of a geometry on the first layer enclosing a geometry on the second layer, wherein the second asymmetric enclosure design rule applies to geometries on the first layer having a width within a second width range; and
repeat said determine an edge, said determine a patch width, said determine a patch direction, said determine a patch length, and said construct a patch for the violation of the second asymmetric enclosure design rule.

* * * * *